(12) United States Patent
Koh et al.

(10) Patent No.: US 12,471,262 B2
(45) Date of Patent: Nov. 11, 2025

(54) RADIATION SHIELD WITH RADIATION SHIELD GAP

(71) Applicant: Intel Corporation, Santa Clara, CA (US)

(72) Inventors: Boon Ping Koh, Penang (MY); Yew San Lim, Penang (MY); Min Suet Lim, Penang (MY)

(73) Assignee: Intel Corporation, Santa Clara, CA (US)

( * ) Notice: Subject to any disclaimer, the term of this patent is extended or adjusted under 35 U.S.C. 154(b) by 816 days.

(21) Appl. No.: 17/554,814

(22) Filed: Dec. 17, 2021

(65) Prior Publication Data

US 2022/0110229 A1   Apr. 7, 2022

(51) Int. Cl.
*H05K 9/00*   (2006.01)

(52) U.S. Cl.
CPC ......... *H05K 9/0026* (2013.01); *H05K 9/0049* (2013.01)

(58) Field of Classification Search
None
See application file for complete search history.

(56) References Cited

U.S. PATENT DOCUMENTS

| | | | |
|---|---|---|---|
| 7,326,862 B2* | 2/2008 | Lionetta | H05K 9/0032 174/370 |
| 8,237,063 B2* | 8/2012 | Chang | H05K 9/00 174/382 |
| 10,182,518 B2* | 1/2019 | Furutani | H05K 9/0031 |
| 10,542,644 B2* | 1/2020 | Kurz | H05K 9/0032 |
| 11,212,939 B2* | 12/2021 | Schmitt | H01L 23/36 |
| 2006/0134982 A1* | 6/2006 | Zarganis | H05K 9/003 439/607.01 |
| 2009/0211802 A1* | 8/2009 | Poulsen | H05K 9/0026 361/818 |

* cited by examiner

*Primary Examiner* — Allen L Parker
*Assistant Examiner* — Christopher L Augustin
(74) *Attorney, Agent, or Firm* — Banner & Witcoff Ltd.

(57) ABSTRACT

Particular embodiments described herein provide for an electronic device that includes an electronic component, a support structure that includes a radiation source, a radiation shield on the support structure. The radiation shield includes a wall and the wall is not continuous around the radiation source and includes a radiation shield gap, where the electronic component covers the radiation shield gap to complete the radiation shield wall.

19 Claims, 13 Drawing Sheets

RADIATION SHIELD WITH RADIATION SHIELD GAP

TECHNICAL FIELD

This disclosure relates in general to the field of computing, and more particularly, to a radiation shield with a radiation shield gap.

BACKGROUND

Emerging trends in systems place increasing performance demands on the system. One way to attempt to improve performance and function is to increase the density of the devices and systems and pack more computing elements into the devices and systems. The increasing performance demands can create a relatively crowded system as more and more components are located in close proximity to each and can cause radiating noise level increases in the system. Electromagnetic interference (EMI) and radio-frequency interference (RFI) affect almost every electronic device, especially mobile compute devices. In addition, some electrical components are both a source of electromagnetic and radio-frequency radiation and are susceptible to EMI/RFI from adjacent sources. The radiating noise level can cause a reduction in device performance, a reduction in the lifetime of a device, and/or delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
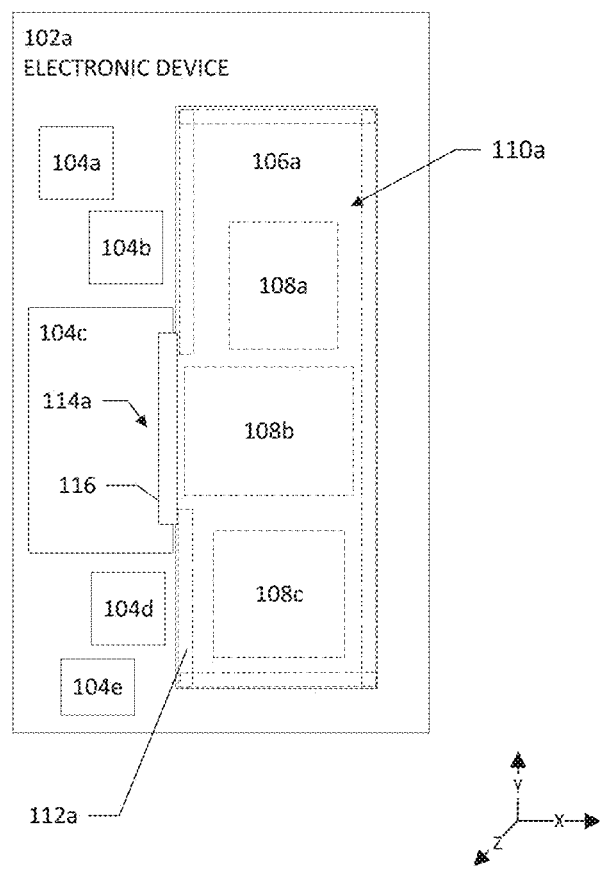
FIG. 1 is a simplified block diagram of a system to enable a radiation shield with a radiation shield gap, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a radiation shield with a radiation shield gap. Features such as structure(s), function(s), and/or characteristic(s), for example, are described with reference to one embodiment as a matter of convenience; various embodiments may be implemented with any suitable one or more of the described features.

In an example, an electronic device includes at least one electronic component (e.g., a battery) and a printed circuit board. The printed circuit board includes a radiation shield over one or more radiation sources (e.g., source of electromagnetic interference (EMI) and/or radio-frequency interference (RFI)). The radiation shield includes a radiation shield wall that does not extend continuously around the one or more radiation sources and includes a radiation shield gap or space. The electronic component is next to the printed circuit board and fills in the radiation shield gap to complete the radiation shield wall. Because the radiation shied gap does not include the rations shield wall, the radiation shield gap expands the available area on the printed circuit board about the width of the radiation shield wall and allows for addition space on the printed circuit board to be used for tracing and/or to accommodate the radiation source or a different component on the printed circuit board.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "directly on" a second layer is in direct contact with that second layer. Similarly, unless explicitly stated otherwise, one feature disposed between two features may be in direct contact with the adjacent features or may have one or more intervening layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example. The term "about" indicates a tolerance of twenty percent (20%). For example, about one (1) millimeter (mm) would include one (1) mm and ±0.2 mm from one (1) mm. Similarly, terms indicating orientation of various elements, for example, "coplanar," "perpendicular," "orthogonal," "parallel," or any other angle between the elements generally refer to being within +/−5-20% of a target value based on the context of a particular value as described herein or as known in the art.

FIG. 1 is a simplified block diagram of an electronic device configured with a radiation shield wall structure, in accordance with an embodiment of the present disclosure. In an example, an electronic device 102a can include one or more electronic components 104a-104e and a support structure 106a. Each of the electronic components 104a-104e can be a device or group of devices available to assist in the operation or function of the electronic device 102a. The support structure 106a can include one or more radiation sources 108. For example, as illustrated in FIG. 1, the support structure 106a includes radiation sources 108a-108c. Each of the radiation sources 108a-108c can be an electronic device that emits radiation, especially electromagnetic radiation that can cause electromagnetic interference (EMI) and/or radio frequency radiation that can cause radiofrequency interference (RFI). A radiation shield 110a can be over the radiation sources 108a-108c. The radiation shield 110a can include a radiation shield wall 112a that partially extends around the radiation sources 108a-108c on the support structure 106a. In an example, the support structure 106a can be a substrate and more particularly, a PCB.

The radiation shield wall 112a does not continuously extend around the radiation sources 108a-108c and includes a radiation shield gap 114a in the radiation shield wall 112a. The radiation shield gap 114a allows for addition space on the support structure 106a to be used for tracing and/or to accommodate one or more radiation sources 108 (e.g., radiation source 108b). If the radiation shield wall 112a was continuous, then the radiation shield wall 112a would occupy space on the support structure 106a that could be used for tracing and/or to accommodate a radiation source 108.

One of the electronic components 104 (e.g., electronic components 104c) can extend across the radiation shield gap 114a in the radiation shield wall 112a and cover the radiation shield gap 114a. A conductive layer 116 can be over the portion of the electronic component 104 that extends across the radiation shield gap 114a in the radiation shield wall 112a. The conductive layer 116 over the portion of the electronic component 104 helps to close the gap in the radiation shield wall 112a. In some examples, the conductive layer 116 can be copper tape. The conductive layer 116 has a thickness less than about 1.5 mm or some other thickness that is less than or equal to the thickness of the radiation shield wall 112. If the electronic component 104 is a battery, the conductive layer 116 can be isolated from the battery so the battery is not shorted. More specifically, if the electronic component 104 is a battery, an isolating layer can be between the battery and the conductive layer 116. The insulating layer can be about 0.1 mm or about 0.15 mm or any other thickness that would allow the conductive layer 116 to be isolated from the electronic component 104 as long as the total thickness of the conductive layer 116 and the insulating layer is less than or equal to the thickness of the radiation shield wall 112.

By creating the radiation shield gap 114a in the radiation shield wall 112a, additional area in the X plane (or Y plane, depending on the orientation) on the support structure 106a can be created to accommodate tracings and one or more radiation sources 108. The term "X plane," refers to the plane along the "X" axis of an (x, y, z) coordinate axis or cartesian coordinate system, the term "Y plane," refers to the plane along the "Y" axis of the (x, y, z) coordinate axis or cartesian coordinate system, and the term "Z plane," refers to the plane along the "Z" axis of the (x, y, z) coordinate axis or cartesian coordinate system.

The radiation shield 110a is comprised of a conducive material and can include stainless steel, copper, an alloy such as nickel copper, or some material that is conductive, rigid, and can help contain or mitigate the radiation from the one or more radiation sources 108 from extending past the radiation shield 110a or at least partially contain or mitigate the radiation from the one or more radiation sources 108 from extending past the radiation shield 110a. The conductive layer 116 over the portion of the electronic component 104 that extends across the radiation shield gap 114a in the radiation shield wall 112a is comprised of a conducive material and can include stainless steel, copper, an alloy such as nickel copper, or some material that is conductive, and can help ground the radiation shield 110a and help contain or mitigate the radiation from the one or more radiation sources 108 from extending past the radiation shield 110a or at least partially contain or mitigate the radiation from the one or more radiation sources 108 from extending past the radiation shield 110a. The radiation may be electromagnetic radiation, internal and external Wi-Fi and cellular radio-frequency radiation, high speed input/output (I/O) trace/connector digital noise radiation, switching voltage regulator radiation, or some other type of radiation that can have an undesirable effect on one or more components of an electronic device.

EMI and radio-frequency interference RFI affect almost every electronic device, especially mobile compute devices. System on a chip (SoC) packages are both a source of electromagnetic radiation and radio-frequency radiation and are susceptible to EMI/RFI from adjacent sources. For example, when a smartphone is placed on or near a keyboard of a laptop, performance of the laptop is often impacted (e.g., laptop screen flicker, CPU hang, reboot of the system, etc.). The term "radiation" includes electromagnetic radiation, radio-frequency radiation, and other similar radiation that can cause an undesirable effect on one or more components of an electronic device.

It is to be understood that other embodiments may be utilized and structural changes may be made without departing from the scope of the present disclosure. Substantial flexibility is provided in that any suitable arrangements and configuration may be provided without departing from the teachings of the present disclosure.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. One way to increase performance and function is to increase the density of the devices and systems and pack more computing elements into the devices and systems. However, the increase in computing elements causes an increase in the EMI and RFI. EMI and RFI affect almost every electronic device, especially mobile compute devices. In addition, SoC packages are both a source of electromagnetic and radio-frequency radiation and are susceptible to EMI/RFI from adjacent sources.

Die and package radiation have been identified as RFI risk factors. In addition, radio frequency signals from internal radios and external smartphones in proximity to personal computers have interfered with the SoCs and caused basic functionality issues, including display flickering and system hang/reboot. Some SoC designs introduce disaggregation and multichip package (MCP) using an embedded multi-die interconnect bridge (EMIB) which can increase both RFI and immunity risk. Also, scalable package-level shielding techniques (simultaneously shielding both the package and the dies) are required for some Internet of Things (IoT) devices, data centers, SoCs, and seven/ten (7/10) nm disaggregated systems.

In some systems, the package layer-count increases to provide a package surface shielding with a ground layer at the expense of package cost and system Z-height (the height of the system along the Z plane). However, the package surface shielding can be insufficient because of multiple-die radiation. In addition, package surface shielding with an additional ground layer reduces radio frequency noise radiation/coupling but at the expense of package cost and Z-height increases. In other systems, a conductive coating may be used. However, a conductive coating, such as metal sputtering, is considered to be prohibitively-expensive and is an uncertified manufacturing process for SoC applications and high-volume manufacturing.

In addition, in an electronic device, electronic components are located on a substrate, commonly referred to as a "board". The board includes the electronic components and traces that connect the electronic components. A trace is a conductive path that electrically connects one or more connectors and/or one or more components to each other. The board has a limited width and typically needs to accommodate the electronic components, the traces, and an EMI shield. The EMI shield includes an EMI shield wall that is typically about two (2) mm in thickness. To increase the available space on the board for components and traces, a thin shield frame design (e.g., less than 2 mm) can be used for an EMI shield, however, EMI/RF leakage will often occur due to thin shield frame designs. Also, the size of the components can be reduced but this can lead to a reduction in performance of the components. The board width can be increase, but increasing the board width reduces the size of the battery and other components in the system that are not on the board and a reduction in the size of the battery can affect the performance of the system.

In a specific example, some systems, a narrow board (e.g., about thirty (30) mm) forces four (4) power management integrated circuits (PMICs) to be placed at the end (e.g., the south end) of the board, far away from processor cores. The location of the PMICs can lead to a higher load line (LL) and processor (e.g., CPU) performance tradeoffs. LL reduction and higher processor performance can be achieved if one (1) IA Core rail PMIC out of the four (4) PMICs is placed side by side with a processor, however this grows the board by two (2) mm to thirty-two (32) mm, exceeding the thirty (30) mm target. What is needed is a radiation shield that can be coupled to a board without occupying about two (2) mm or more of the board.

A radiation shield, as outlined in FIG. 1, can resolve these issues (and others). In an example, a radiation shield (e.g., radiation shield 110a) can be on a support structure (e.g., the support structure 106a). The radiation shield can have a radiation shield wall that has a radiation shield gap (e.g., the radiation shield gap 114). An electronic component (e.g., electronic component 104c) that is not on the support structure can extend the length of the radiation shield gap to cover or fill in the gap and function as part of the radiation shield wall. The electronic component that extends the length of the radiation shield gap can include a conductive layer to help ground the radiation shield and help the electronic component function as part of the radiation shield wall.

A connection between the radiation shield and a conductive layer or conductive covering on the electronic component can help provide grounding of the radiation shield. In a specific example, C-shaped wrapped EMI copper tape can be used as the conductive layer. At the vertical edges of the radiation shield gap, a vertical sidewall with vertical dimple fingers can be used to help provide grounding of the radiation shield and help to prevent radiation leaks from the radiation shield. Along the horizontal edge of the radiation shield gap, a horizontal extension can extend from the shield lid to the conductive layer to help provide grounding of the radiation shield and help to prevent radiation leaks from the radiation shield. In an example, the horizontal extension can include horizontal dimple fingers that extend from the radiation shield lid and contact the conductive layer. A gasket (e.g., metallic gasket) on the bottom of the support structure between the support structure and the chassis of the electronic device can be in contact with the vertical sidewall with vertical dimple fingers and the conductive layer to couple the conductive layer and the vertical sidewall to a ground layer of the support structure to help ground the radiation shield.

The radiation shield with a radiation shield gap expands the area on the substrate that is available for components and trace lines. In a specific example of a thirty (30) mm support substrate and a radiation shield with about two (2) mm walls, the radiation shield with a radiation shield gap can increase the available area on the support structure to a width of about 29.5 mm. This can accommodate one (1) PMIC to be placed side by side with a processor on the silicon for better processor LL and performance while maintaining a narrow thirty (30) mm board width target. In some examples, by increasing the area on the substrate that is available for components and trace lines, better processor performance in LNL-M SIP can be achieved by freeing up more area for a side PMIC. The side PMIC can help bring output closer to the processor for an improved LL and performance as compared to if the PD/VR output was on a side of the support structure that was opposite the processor. Note that the radiation shield with a radiation shield gap can be applied to different designs and component placement depending on design choice and design constrains.

If the component is a battery, a side of the battery facing the support structure can be covered with a conductive layer (e.g., conductive layer 116) and act as the vertical shield wall. This frees up the area of the support structure that would have included the radiation shield wall and can allow for more traces and other components to be located in the area that would have included the radiation shield wall. By increasing the area on the substrate that is available for components and trace lines, the size of the substrate does not need to be increased. Because the substrate does not need to be increased, the battery does not need to be decreased.

The radiation shield wall can include multiple radiation shield gap locations. For example, one or more radiation shield gap locations can be present in the radiation shield wall so long as each radiation shield gap is closed off by an electronic component and conductive layer. Note that the same electronic component does not need to extend across each radiation shield gap location. The radiation shield gap location can be located along the full length of the electronic component or at a localized region wherever a component and/or traces need to fit onto the support structure. The radiation shield gap can be along both edges of a support substrate when an electronic component is present on both side of the support substrate (e.g., with dual battery topology systems).

The radiation shield and the conductive layer on the electronic component can be coupled to a ground plane to help provide a path for grounding contact for the radiation shield. The connection between the radiation shield and the conductive layer on the electronic component helps to provide a shield against the effects of electromagnetic waves. More specifically, the radiation shield can provide attenuations of 80 dB for a lower frequency of 2.45 GHz and at least 30 dB attenuation for a higher frequency of 6.5 GHz.

In an example, the contact between the radiation shield and the conductive layer on the electronic component can be secured by interference design of the horizontal extension. In an example, the horizontal extension can include horizontal dimple fingers that extend from the radiation shield lid and contact the conductive layer. The horizontal dimple fingers can be configured such that the conductive layer over the electronic component can be pushing the dimple spring finger backwards when coupled together to help ensure contact between the conductive layer on the electronic component and the radiation shield. In an example, the radiation shield wall, the radiation shield lid, the horizontal extension, and the vertical extension define an interior space of the radiation shield that can house a radiation source that emits EMI and/or RFI. In another example, the radiation shield lid, the horizontal extension, and the vertical extension define an interior space of the radiation shield that houses a radiation sensitive device that is affected by EMI and/or RFI.

Figure 2:
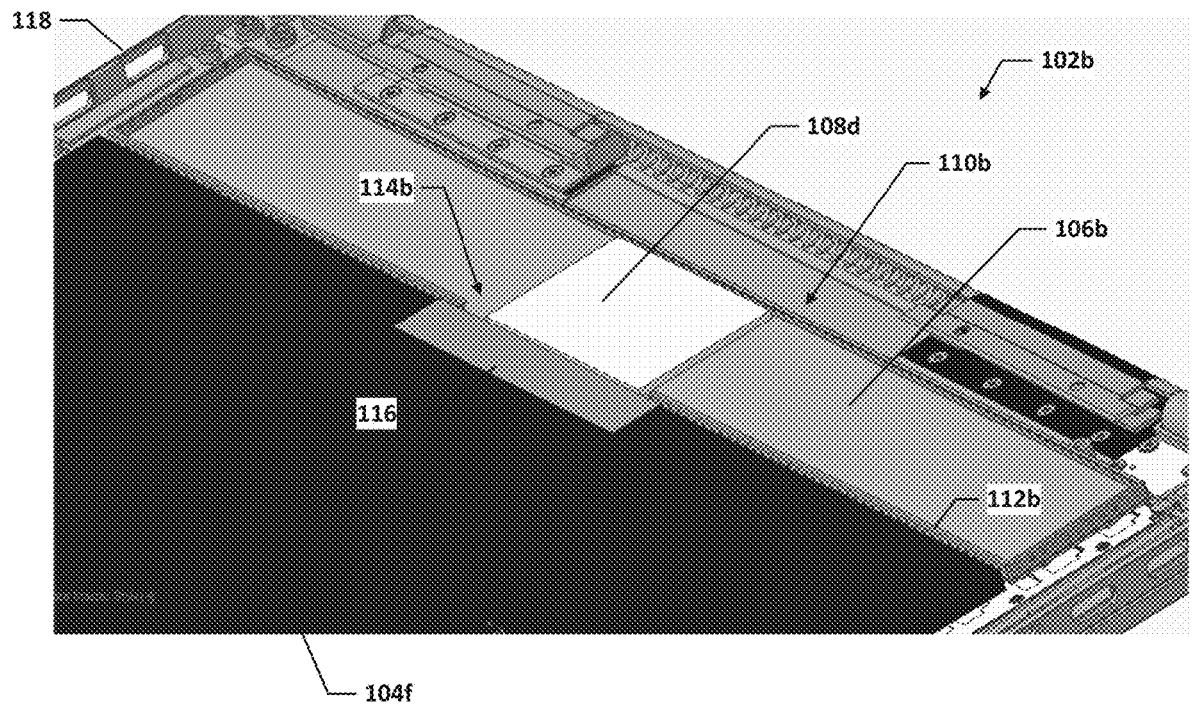
FIG. 2 is a simplified perspective cut away top view of a portion of a system to enable a radiation shield with a radiation shield gap, in accordance with an embodiment of the present disclosure.

Turning to FIG. 2, FIG. 2 is a simplified block diagram of a cut away perspective view of a portion of an electronic device 102*b*, in accordance with an embodiment of the present disclosure. In an example, the electronic device 102*b* can include an electronic component 104*f*, a support structure 106*b*, and a chassis 118. In some examples, the support structure 106*b* can be a PCB. The support structure 106*b* can include one or more radiation sources 108. For example, as illustrated in FIG. 2, the support structure 106*b* includes radiation source 108*d*. A radiation shield 110*b* can be coupled to the support structure 106*b* and over the one or more radiation sources 108 to help contain the radiation from the one or more radiation sources 108. The radiation shield 110*b* can include a radiation shield wall 112*b*. (Note that a radiation shield lid is not illustrated.) The radiation shield wall 112*b* can include a radiation shield gap 114*b*. In an example, the support structure 106*b* can be a substrate and more particularly, a PCB The radiation shield gap 114*b* allows for addition space on the support structure 106*b* to be used for tracing and/or to accommodate the radiation source 108*d*. If the radiation shield wall 112*b* was continuous, then the radiation shield wall 112*b* would occupy space on the support structure 106*b* that could be used for tracing and/or to accommodate the radiation source 108*d*.

In an example, the electronic component 104*f* can be a battery for the electronic device 102*b*. The electronic component 104*f* can extend across the radiation shield gap 114*b* in the radiation shield wall 112*b* and cover the radiation shield gap 114*b*. A conductive layer 116 can be over the portion of the electronic component 104*f* that extends across the radiation shield gap 114*b* in the radiation shield wall 112*b*. The conductive layer over the portion of the electronic component 104*f* that extends across the radiation shield gap 114*b* helps to close the gap in the radiation shield wall 112*b*. By creating the radiation shield gap 114*b* in the radiation shield wall 112*b*, additional area in the X plane (or Y plane, depending on the orientation) on the support structure 106*b* can be created to accommodate tracings and the radiation source 108*d*.

Figure 3:
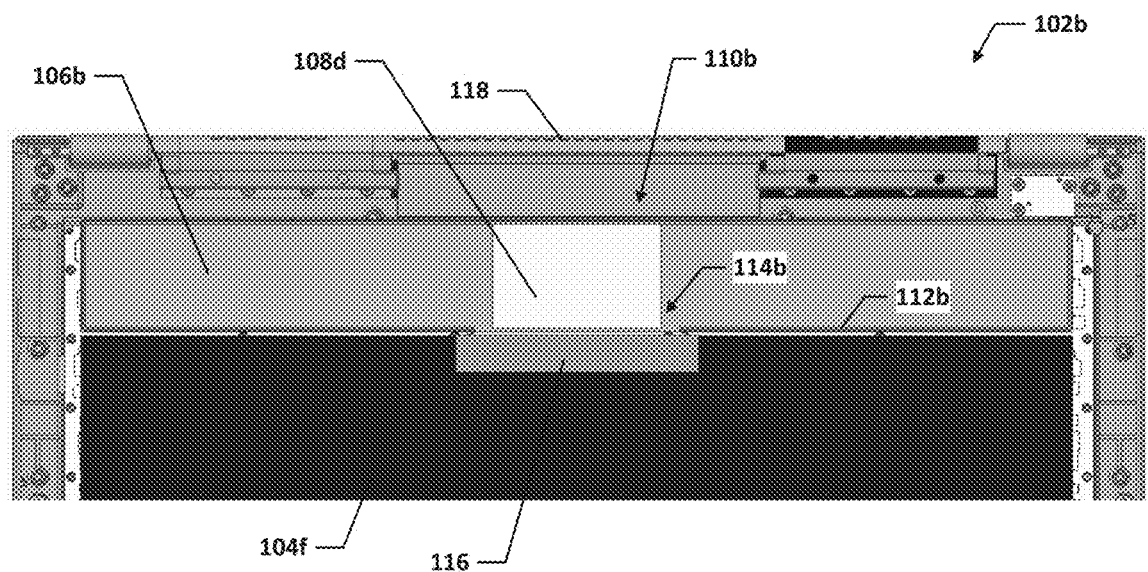
FIG. 3 is a simplified block diagram cut away top view of a portion of a system to enable a radiation shield with a radiation shield gap, in accordance with an embodiment of the present disclosure.

Turning to FIG. 3, FIG. 3 is a simplified block diagram of a cut away top view of a portion of an electronic device 102*b*, in accordance with an embodiment of the present disclosure. In an example, the electronic device 102*b* can include the electronic component 104*f*, the support structure 106*b*, and the chassis 118. In some examples, the support structure 106*b* can be a PCB. The support structure 106*b* can include one or more radiation sources 108. For example, as illustrated in FIG. 3, the support structure 106b includes radiation source 108d. The radiation shield 110b can be coupled to the support structure 106b and over the one or more radiation sources 108 to help contain the radiation from the one or more radiation sources 108. The radiation shield 110b can include the radiation shield wall 112b. The radiation shield wall 112b can include the radiation shield gap 114b. The radiation shield gap 114b allows for addition space on the support structure 106b to be used for tracing and/or to accommodate the radiation source 108d. If the radiation shield wall 112b was continuous, then the radiation shield wall 112b would occupy space on the support structure 106b that could be used for tracing and/or to accommodate the radiation source 108d.

The electronic component 104f can extend across the radiation shield gap 114b in the radiation shield wall 112b. The conductive layer 116 can be over the portion of the electronic component 104f that extends across the radiation shield gap 114b in the radiation shield wall 112b. The conductive layer over the portion of the electronic component 104f that extends across the radiation shield gap 114b helps to close the gap in the radiation shield wall 112b. By creating the radiation shield gap 114b in the radiation shield wall 112b, additional area in the X plane (or Y plane, depending on the orientation) on the support structure 106b can be created to accommodate tracings and the radiation source 108d.

Figure 4:
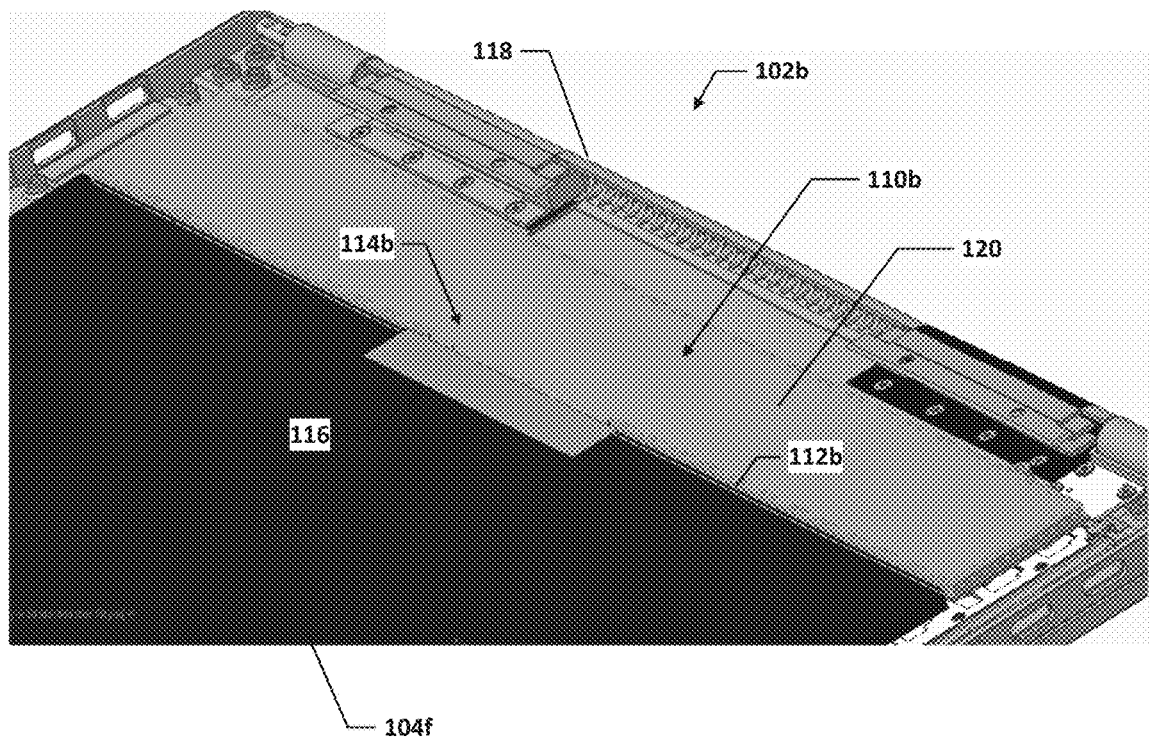
FIG. 4 is a simplified perspective cut away top view of a portion of a system to enable a radiation shield with a radiation shield gap, in accordance with an embodiment of the present disclosure.

Turning to FIG. 4, FIG. 4 is a simplified diagram of a cut away perspective view of a portion of the electronic device 102b, in accordance with an embodiment of the present disclosure. In an example, the electronic device 102b can include the electronic component 104f, the support structure 106b, and the chassis 118. In some examples, the support structure 106b can be a PCB. The support structure 106b can include one or more radiation sources 108 (not shown). The radiation shield 110b can be coupled to the support structure 106b and over the one or more radiation sources 108 to help contain the radiation from the one or more radiation sources 108. The radiation shield 110b can include the radiation shield wall 112b and a radiation shield lid 120. The radiation shield wall 112b can include the radiation shield gap 114b. The radiation shield gap 114b allows for addition space on the support structure 106b to be used for tracing and/or to accommodate the one or more radiation sources 108. If the radiation shield wall 112b was continuous, then the radiation shield wall 112b would occupy space on the support structure 106b that could be used for tracing and/or to accommodate the one or more radiation sources 108.

The electronic component 104f can extend across the radiation shield gap 114b in the radiation shield wall 112b. The conductive layer 116 can be over the portion of the electronic component 104f that extends across the radiation shield gap 114b in the radiation shield wall 112b. The conductive layer over the portion of the electronic component 104f helps to close the gap in the radiation shield wall 112b. By creating the radiation shield gap 114b in the radiation shield wall 112b, additional area in the X plane (or Y plane, depending on the orientation) on the support structure 106b can be created to accommodate tracings and the one or more radiation sources 108.

Figure 5:
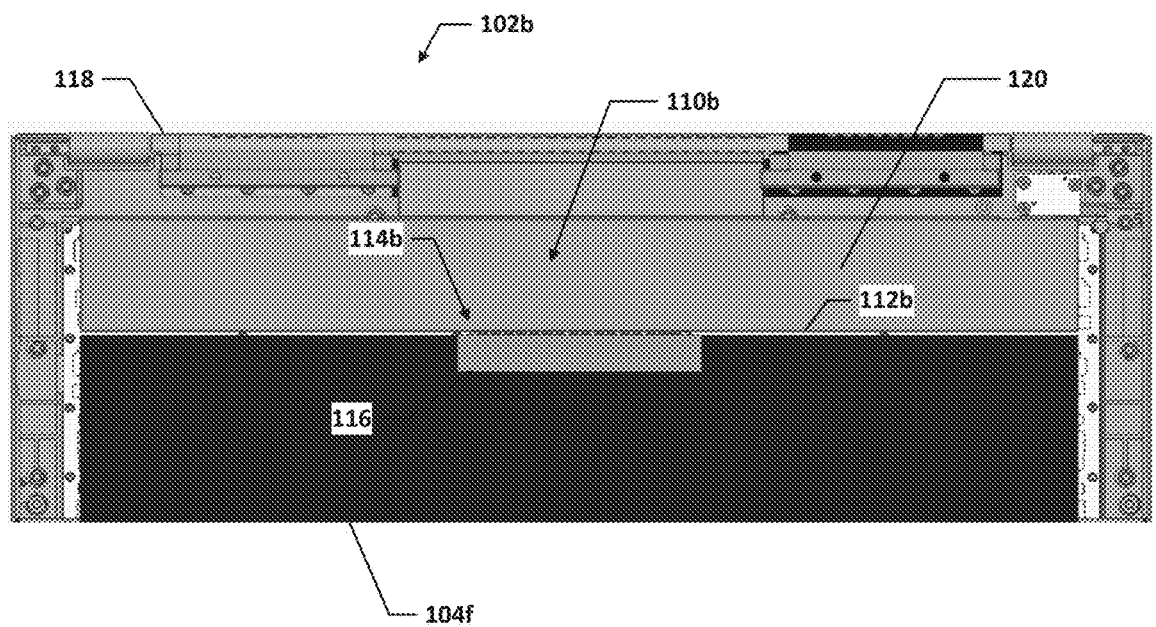
FIG. 5 is a simplified cut away top view of a portion of a system to enable a radiation shield with a radiation shield gap, in accordance with an embodiment of the present disclosure.

Turning to FIG. 5, FIG. 5 is a simplified diagram of a cut away top view of a portion of the electronic device 102b, in accordance with an embodiment of the present disclosure. In an example, the electronic device 102b can include the electronic component 104f, the support structure 106b, and the chassis 118. The support structure 106b can include one or more radiation sources 108 (not shown). The radiation shield 110b can be coupled to the support structure 106b and over the one or more radiation sources 108 to help contain the radiation from the one or more radiation sources 108. The radiation shield 110b can include the radiation shield wall 112b and the radiation shield lid 120. The radiation shield wall 112b can include the radiation shield gap 114b. The radiation shield gap 114b allows for addition space on the support structure 106b to be used for tracing and/or to accommodate the one or more radiation sources 108. If the radiation shield wall 112b was continuous, then the radiation shield wall 112b would occupy space on the support structure 106b that could be used for tracing and/or to accommodate the one or more radiation sources 108.

The electronic component 104f can extend across the radiation shield gap 114b in the radiation shield wall 112b. The conductive layer 116 can be over the portion of the electronic component 104f that extends across the radiation shield gap 114b in the radiation shield wall 112b. The conductive layer over the portion of the electronic component 104f that extends across the radiation shield gap 114b helps to close the gap in the radiation shield wall 112b. By creating the radiation shield gap 114b in the radiation shield wall 112b, additional area in the X plane (or Y plane, depending on the orientation) on the support structure 106b can be created to accommodate tracings and the radiation source 108d.

Figure 6:
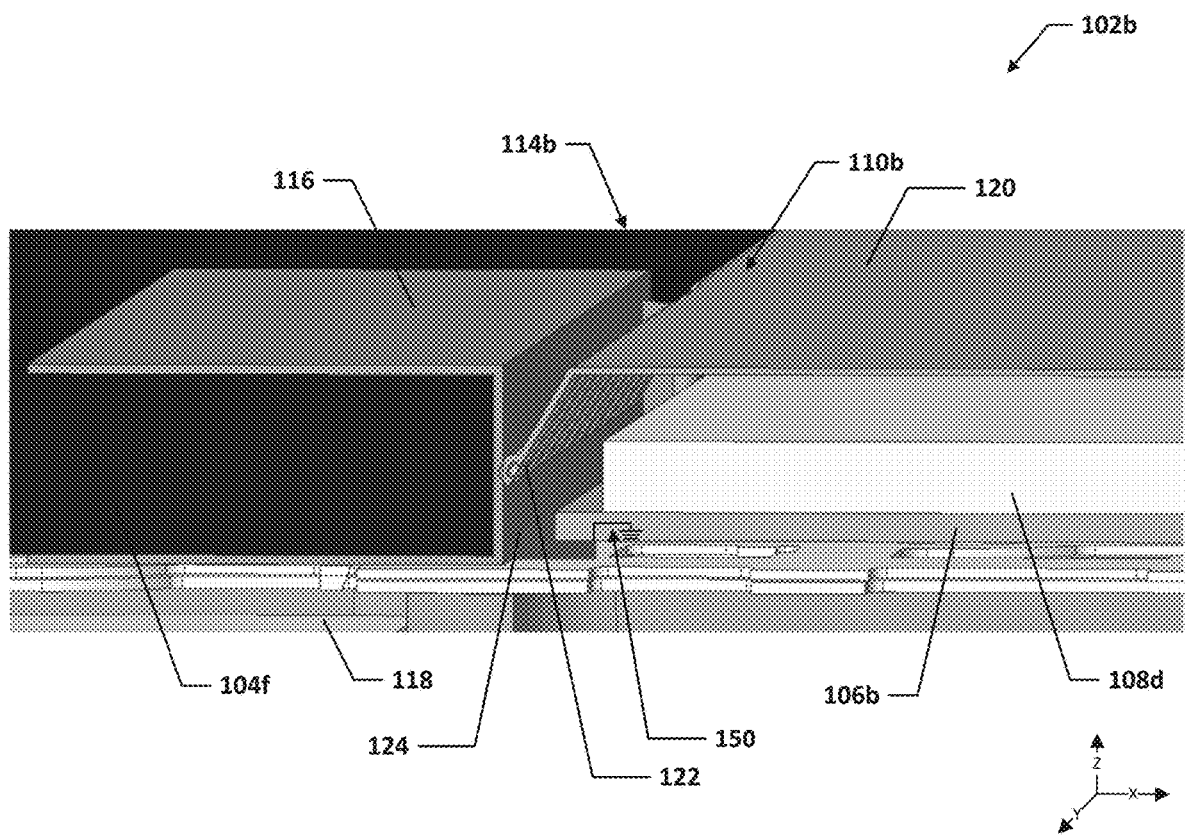
FIG. 6 is a simplified perspective side cut away view of a portion of a system to enable a radiation shield with a radiation shield gap, in accordance with an embodiment of the present disclosure.

Turning to FIG. 6, FIG. 6 is a simplified diagram of a cut away side view of a portion of the electronic device 102b, in accordance with an embodiment of the present disclosure. In an example, the electronic device 102b can include the electronic component 104f, the support structure 106b, and the chassis 118. In some examples, the support structure 106b can be a PCB. The support structure 106b can include one or more radiation sources 108. For example, FIG. 6 illustrates the radiation source 108d. The radiation shield 110b can be coupled to the support structure 106b and over the one or more radiation sources 108 to help contain the radiation from the one or more radiation sources 108. The radiation shield 110b can include the radiation shield wall 112b (not shown), the radiation shield lid 120, and a horizontal extension 122 to help provide grounding of the radiation shield 110b and help to prevent radiation leaks from the radiation shield 110b. In an example, the horizontal extension 122 can include horizontal dimple fingers that extend from the radiation shield lid 120 and contact the conductive layer 116 to help provide grounding of the radiation shield 110b and help to prevent radiation leaks from the radiation shield 110b. The horizontal dimple fingers can be configured such that the conductive layer 116 over the electronic component 104f can push the dimple finger backwards when coupled together to help ensure contact between the conductive layer 116 on the electronic component and the radiation shield 110b.

The radiation shield wall 112b (not shown) can include the radiation shield gap 114b. The radiation shield gap 114b allows for addition space on the support structure 106b to be used for tracing and/or to accommodate the radiation source 108d. The electronic component 104f can extend across the radiation shield gap 114b in the radiation shield wall 112b (not shown). The conductive layer 116 can be over the portion of the electronic component 104f that extends across the radiation shield gap 114b in the radiation shield wall 112b (not shown). The conductive layer over the portion of the electronic component 104f helps to close the gap in the radiation shield wall 112b (not shown). In an example, a ground contact 124 can be between the support structure 106b and the chassis 118. In an example, the ground contact 124 can be in contact with the conductive layer 116 and a ground plane 150 of the support structure 106*b* to help ground the radiation shield 110*b*. The ground contact 124 can be between the support structure 106*b* and the chassis 118. In an example, the ground contact 124 can be a conductive compressible gasket or some other similar material that can help coupled the conductive layer 116 to the ground plane 150 of the support structure 106*b*. In a specific example, the ground contact 124 is compressible from about one (1) mm to about 0.5 mm.

Figure 7:
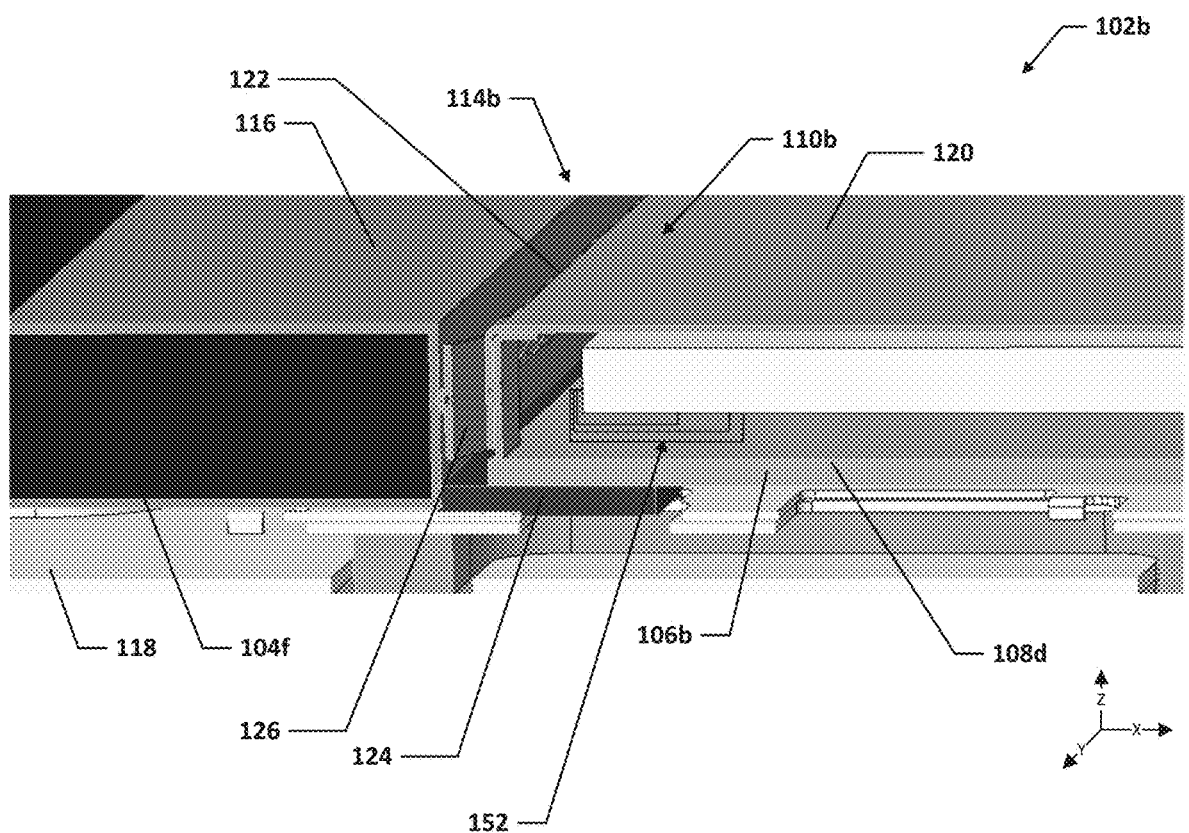
FIG. 7 is a simplified perspective side cut away view of a portion of a system to enable a radiation shield with a radiation shield gap, in accordance with an embodiment of the present disclosure.

Turning to FIG. 7, FIG. 7 is a simplified block diagram of a cut away side view of a portion of the electronic device 102*b*, in accordance with an embodiment of the present disclosure. In an example, the electronic device 102*b* can include the electronic component 104*f*, the support structure 106*b*, and the chassis 118. In some examples, the support structure 106*b* can be a PCB and include traces 152. The support structure 106*b* can include one or more radiation sources 108. For example, FIG. 7 illustrates the radiation source 108*d*. The radiation shield 110*b* can be coupled to the support structure 106*b* and over the one or more radiation sources 108 to help contain the radiation from the one or more radiation sources 108. The radiation shield 110*b* can include the radiation shield wall 112*b* (not shown), the radiation shield gap 114*b*, the radiation shield lid 120, the horizontal extension 122, and a vertical extension 126 to help provide grounding of the radiation shield 110*b* and help to prevent radiation leaks from the radiation shield 110*b*. In an example, the horizontal extension 122 can include horizontal dimple fingers that extend from the radiation shield lid 120 and contact the conductive layer 116 to help provide grounding of the radiation shield 110*b* and help to prevent radiation leaks from the radiation shield 110*b*. The vertical extension 126 can extend along the vertical edges of the radiation shield gap 114*b* to help provide grounding of the radiation shield 110*b* and help to prevent radiation leaks from the radiation shield 100*b*. In an example, the vertical extension 126 can include one or more vertical dimple fingers to help provide grounding of the radiation shield and help to prevent radiation leaks from the radiation shield. Note that the radiation shield 110*b* would include another vertical extension 126 that would extend along the other vertical edge of the radiation shield gap 114*b* (e.g., similar to the vertical extensions 126 on either side of the radiation shield gap 114*c* illustrated in FIG. 9).

The radiation shield gap 114*b* allows for addition space on the support structure 106*b* to be used for tracing and/or to accommodate the radiation source 108*d*. The electronic component 104*f* can extend across the radiation shield gap 114*b* in the radiation shield wall 112*b* (not shown). The conductive layer 116 can be over the portion of the electronic component 104*f* that extends across the radiation shield gap 114*b* in the radiation shield wall 112*b* (not shown). The conductive layer over the portion of the electronic component 104*f* helps to close the gap in the radiation shield wall 112*b* (not shown). In an example, the ground contact 124 can be between the support structure 106*b* and the chassis 118. In an example, the ground contact 124 can be in contact with the conductive layer 116, vertical extension 126, and a ground plane (not shown) of the support structure 106*b* to help ground the radiation shield 110*b*.

Figure 8A:
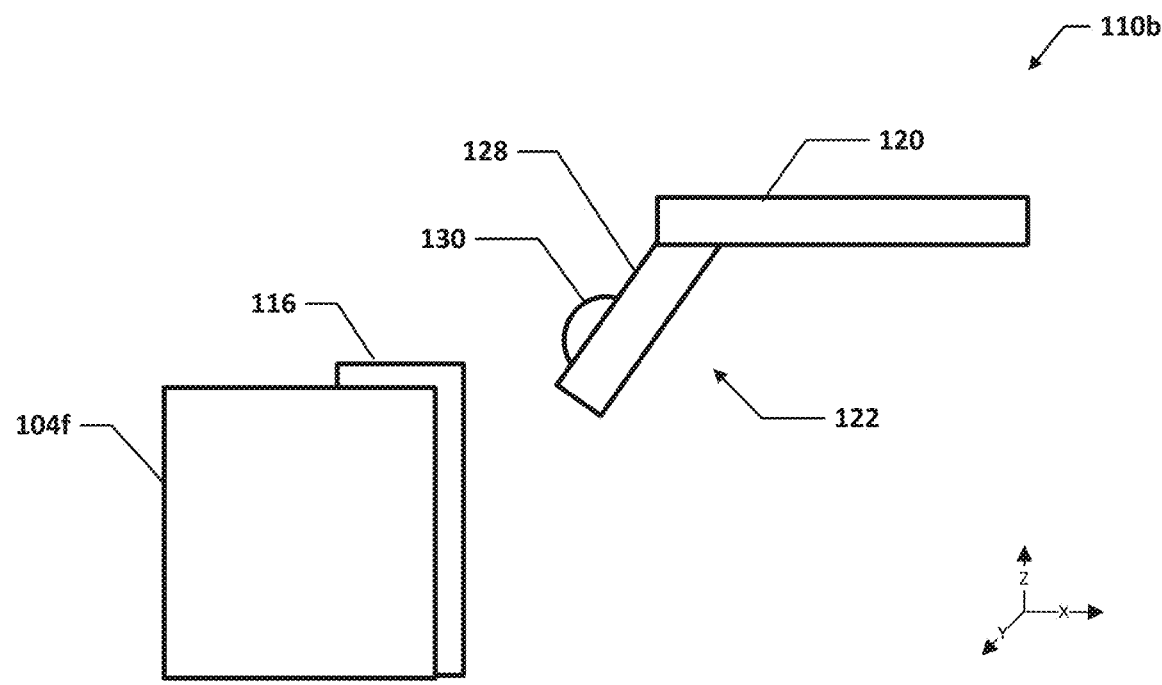
FIGS. 8A and 8B are simplified block diagrams illustrating example details of a portion of a system to enable a radiation shield with a radiation shield gap.

Turning to FIG. 8A, FIG. 8A is a simplified block diagram of a cut away side view of a portion of the radiation shield 110*b*, in accordance with an embodiment of the present disclosure. In an example, the radiation shield 110*b* can include the radiation shield lid 120 and the horizontal extension 122. In an example, the horizontal extension 122 can include one or more horizontal extension arms 128. Each of the horizontal extension arms 128 can include a dimple 130. Before the horizontal extension 122 is coupled to the conductive layer 116 on the electronic component 104*f*, each of the horizontal extension arms 128 are biased to extend out and away from the radiation shield lid 120. For example, as illustrated in FIG. 8A, the horizontal extension arm 128 is biased to extend along the X-plane out and away from the radiation shield lid 120.

Figure 8B:
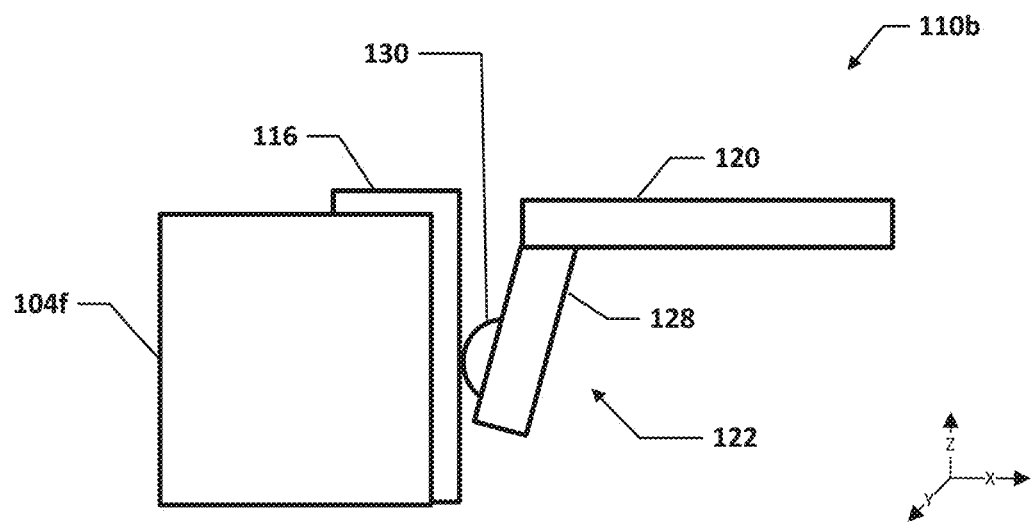

Turning to FIG. 8B, FIG. 8B is a simplified block diagram of a cut away side view of a portion of the radiation shield 110*b*, in accordance with an embodiment of the present disclosure. In an example, the radiation shield 110*b* can include the radiation shield lid 120 and the horizontal extension 122. In an example, the horizontal extension 122 can include the one or more horizontal extension arms 128. Each of the horizontal extension arms 128 can include the dimple 130. After the horizontal extension 122 is coupled to the conductive layer 116 on the electronic component 104*f*, the dimple 130 makes contact with the conductive layer 116 and the horizontal extension arm 128 is forced inward and towards the radiation shield lid 120. For example, as illustrated in FIG. 8B, the horizontal extension arm 128 is forced inwards along the X-plane towards the radiation shield lid 120. Because the horizontal extension arm 128 is biased to extend out and away from the radiation shield lid 120 (as illustrated in FIG. 8A), a force is created that pushes the dimple 130 against the conductive layer 116 to help ensure contact between the conductive layer 116 on the electronic component 104*f* and the horizontal extension 122 that is coupled to the radiation shield lid 120 of the radiation shield 110*b*. Note that the vertical extension 126 can include similar features as those illustrated in FIGS. 8A and 8B and a similar extension arm and dimple configuration to help couple and secure the vertical extension 126 to the conductive layer and provide grounding of the radiation shield 110*b*.

Figure 9:
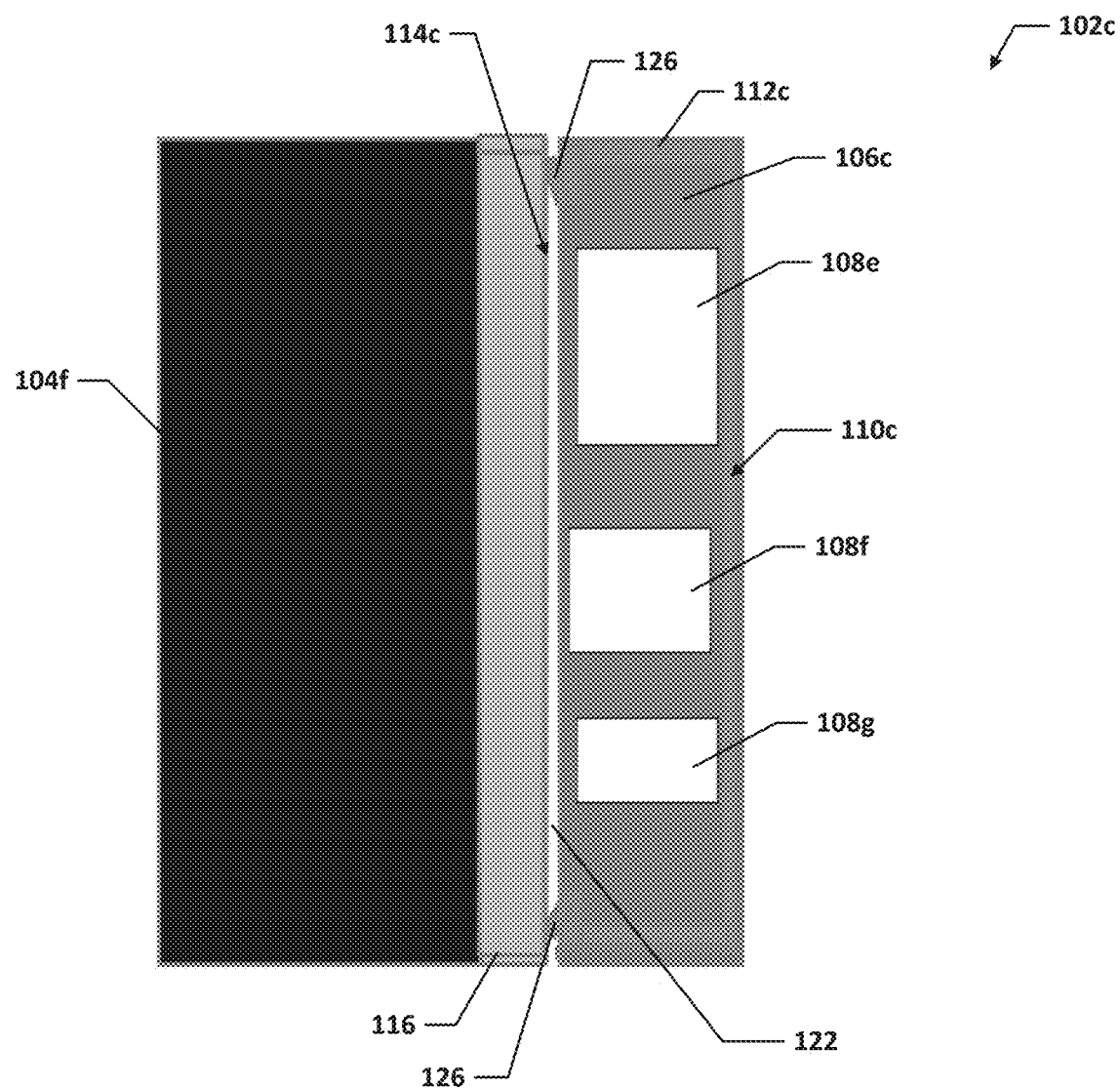
FIG. 9 is a simplified block diagram of a cut away top view of a portion of a system to enable a radiation shield with a radiation shield gap, in accordance with an embodiment of the present disclosure.

Turning to FIG. 9, FIG. 9 is a simplified block diagram of a cut away top view of a portion of an electronic device 102*c*, in accordance with an embodiment of the present disclosure. In an example, the electronic device 102*c* can include the electronic component 104*f* and a support structure 106*c*. In an example, the support structure 106*c* can be a substrate and more particularly, a PCB. The support structure 106*c* can include one or more radiation sources 108*e*-108*g*. A radiation shield 110*c* can be coupled to the support structure 106*c* and over the one or more radiation sources 108*e*-108*g* to help contain the radiation from the one or more radiation sources 108*e*-108*g*. The radiation shield 110*c* can include a radiation shield wall 112*c*, the horizontal extension 122, and the vertical extension 126. The radiation shield wall 112*c* can include a radiation shield gap 114*c*. The radiation shield gap 114*c* allows for addition space on the support structure 106*c* to be used for tracing and/or to accommodate the radiation sources 108*e*-108*g*. If the radiation shield wall 112*c* was continuous, then the radiation shield wall 112*c* would occupy space on the support structure 106*c* that could be used for tracing and/or to accommodate the radiation source 108*e*-108*g*. For example, as illustrated in FIG. 9, the radiation shield gap 114*c* extends more than half the length of the support structure 106*c* to accommodate radiation sources 108*e*-108*g*. It should be noted that the length the radiation shield gap 114*c* extends along the support structure 106*c* depends on design constraints and user preference.

The electronic component 104*f* can extend across the radiation shield gap 114*c* in the radiation shield wall 112*c* and cover the radiation shield gap 114c. The conductive layer 116 can be over the portion of the electronic component 104f that extends across the radiation shield gap 114c in the radiation shield wall 112c. The horizontal extension 122 and the vertical extension 126 can be in contact with the conductive layer 116 to help provide grounding of the radiation shield 110c and help to prevent radiation leaks from the radiation shield 110c. By creating the radiation shield gap 114c in the radiation shield wall 112c, additional area in the X plane (or Y plane, depending on the orientation) on the support structure 106c can be created to accommodate tracings and the radiation sources 108e-108g.

Figure 10:
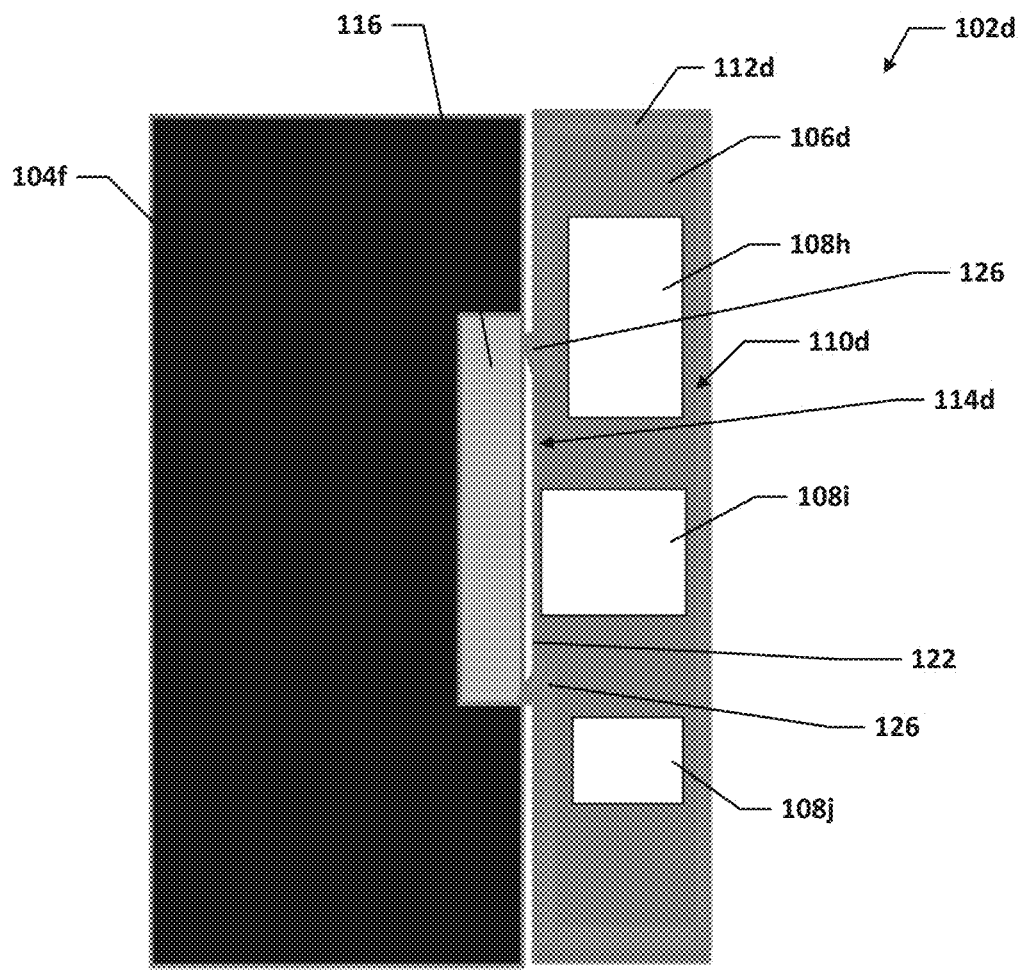
FIG. 10 is a simplified block diagram of a cut away top view of a portion of a system to enable a radiation shield with a radiation shield gap, in accordance with an embodiment of the present disclosure.

Turning to FIG. 10, FIG. 10 is a simplified block diagram of a cut away top view of a portion of an electronic device 102d, in accordance with an embodiment of the present disclosure. In an example, the electronic device 102d can include the electronic component 104f and a support structure 106d. In an example, the support structure 106d can be a substrate and more particularly, a PCB. The support structure 106d can include one or more radiation sources 108h-108j. A radiation shield 110d can be coupled to the support structure 106d and over the one or more radiation sources 108h-108j to help contain the radiation from the one or more radiation sources 108h-108j. The radiation shield 110d can include a radiation shield wall 112d, the horizontal extension 122, and the vertical extension 126. The radiation shield wall 112d can include a radiation shield gap 114d. The radiation shield gap 114d allows for addition space on the support structure 106d to be used for tracing and/or to accommodate the radiation sources 108h-108j. If the radiation shield wall 112d was continuous, then the radiation shield wall 112d would occupy space on the support structure 106d that could be used for tracing and/or to accommodate the radiation source 108i. For example, as illustrated in FIG. 10, the radiation shield gap 114d extends along an approximate middle portion of the support structure 106d to accommodate the radiation source 108i and along a portion of the support structure 106d that includes a part, but not all, of radiation source 108h. It should be noted that the length the radiation shield gap 114d extends along the support structure 106d depends on design constraints and user preference. For example, the approximate middle of the support structure 106d where the radiation shield gap 114d extends can be used to accommodate radiation source 108i. Also, the portion of the support structure 106d that includes a part, but not all, of radiation source 108h where the radiation shield gap 114d extends may be used for tracing.

The electronic component 104f can extend across the radiation shield gap 114d in the radiation shield wall 112d and cover the radiation shield gap 114d. The conductive layer 116 can be over the portion of the electronic component 104f that extends across the radiation shield gap 114d in the radiation shield wall 112d. The horizontal extension 122 and the vertical extension 126 can be in contact with the conductive layer 116 to help provide grounding of the radiation shield 110d and help to prevent radiation leaks from the radiation shield 110d. By creating the radiation shield gap 114d in the radiation shield wall 112d, additional area in the X plane (or Y plane, depending on the orientation) on the support structure 106d can be created to accommodate tracings and the radiation source 108i.

Figure 11:
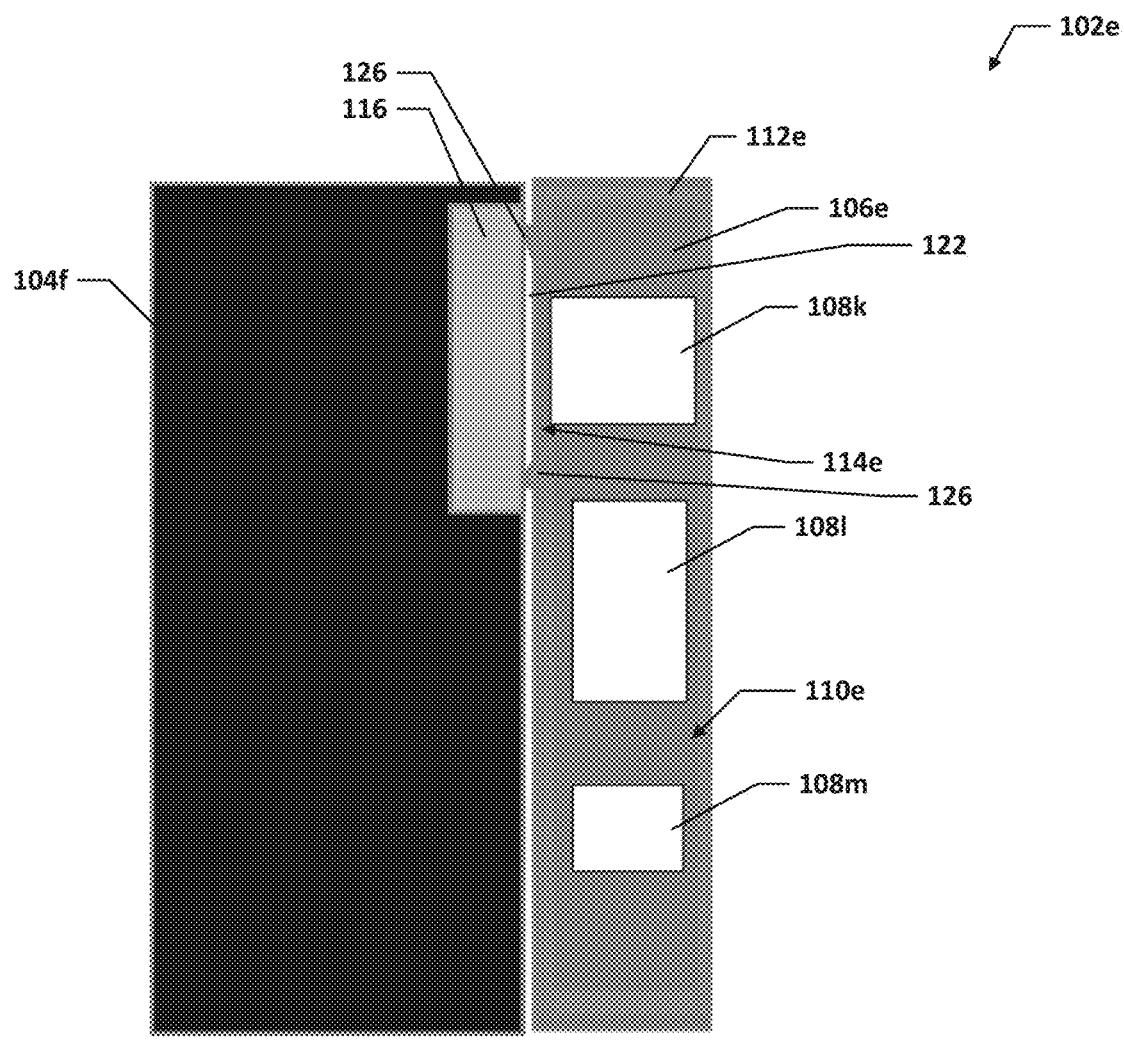
FIG. 11 is a simplified block diagram of a cut away top view of a portion of a system to enable a radiation shield with a radiation shield gap, in accordance with an embodiment of the present disclosure.

Turning to FIG. 11, FIG. 11 is a simplified block diagram of a cut away top view of a portion of an electronic device 102e, in accordance with an embodiment of the present disclosure. In an example, the electronic device 102e can include the electronic component 104f and a support structure 106e. In an example, the support structure 106e can be a substrate and more particularly, a PCB. The support structure 106e can include one or more radiation sources 108k-108m. A radiation shield 110e can be coupled to the support structure 106e and over the one or more radiation sources 108k-108m to help contain the radiation from the one or more radiation sources 108k-108m. The radiation shield 110e can include a radiation shield wall 112e, the horizontal extension 122, and the vertical extension 126. The radiation shield wall 112e can include the radiation shield gap 114e. The radiation shield gap 114e allows for addition space on the support structure 106e to be used for tracing and/or to accommodate the radiation sources 108k-108m. If the radiation shield wall 112e was continuous, then the radiation shield wall 112e would occupy space on the support structure 106e that could be used for tracing and/or to accommodate the radiation source 108k. For example, as illustrated in FIG. 11, the radiation shield gap 114e extends along an area of the support structure 106e around radiation source 108k. It should be noted that the length the radiation shield gap 114e extends along the support structure 106c depends on design constraints and user preference.

The electronic component 104f can extend across the radiation shield gap 114e in the radiation shield wall 112e and cover the radiation shield gap 114e. The conductive layer 116 can be over the portion of the electronic component 104f that extends across the radiation shield gap 114e in the radiation shield wall 112e. The horizontal extension 122 and the vertical extension 126 can be in contact with the conductive layer 116 to help provide grounding of the radiation shield 110e and help to prevent radiation leaks from the radiation shield 110e. By creating the radiation shield gap 114e in the radiation shield wall 112e, additional area in the X plane (or Y plane, depending on the orientation) on the support structure 106e can be created to accommodate tracings and the radiation source 108k.

Figure 12:
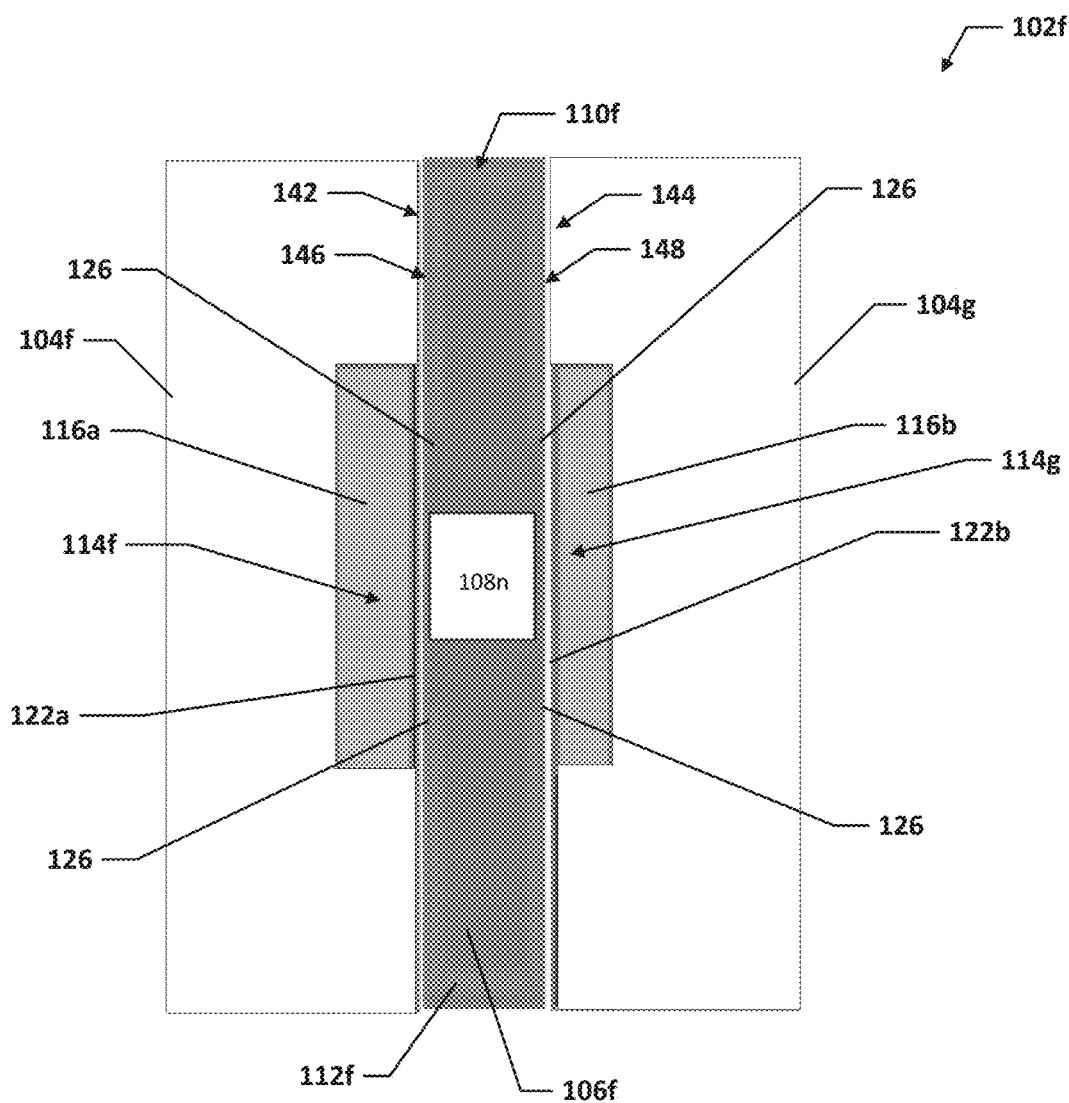
FIG. 12 is a simplified block diagram of a cut away top view of a portion of a system to enable a radiation shield with a radiation shield gap, in accordance with an embodiment of the present disclosure.

Turning to FIG. 12, FIG. 12 is a simplified block diagram of a cut away top view of a portion of an electronic device 102f, in accordance with an embodiment of the present disclosure. In an example, the electronic device 102f can include the electronic component 104f, an electronic component 104g, and a support structure 106f. The electronic component 104f can be on a first side 142 of the support structure 106f and the electronic component 104g can be on a second side 144 of the support structure 106f. In some examples, the electronic component 104f and the electronic component 104g can be the same electronic component (e.g., a battery). In other examples, the electronic component 104f and the electronic component 104g are different electronic components. In an example, the support structure 106f can be a substrate and more particularly, a PCB.

The support structure 106f can include one or more radiation sources 108. For example, as illustrated in FIG. 12, the support structure 106f includes a radiation source 108n. A radiation shield 110f can be coupled to the support structure 106f and over the radiation source 108n to help contain the radiation from the radiation source 108n. The radiation shield 110f can include a radiation shield wall 112g. The radiation shield wall 112g can include a first radiation shield gap 114f and a second radiation shield gap 114g. The first radiation shield gap 114f and the second radiation shield gap 114g allow for addition space on the support structure 106f to be used for tracing and/or to accommodate the radiation source 108n. If the radiation shield wall 112f was continuous, then the radiation shield wall 112f would occupy space on the support structure 106f that could be used for tracing and/or to accommodate the radiation source 108n. For example, as illustrated in FIG. 12, the first radiation shield gap 114f extends along an approximate middle section of the support structure 106f on the first side 142 of the support structure 106f and the second radiation shield gap 114g extends along an approximate middle section of the support structure 106f on the second side 144 of the support structure 106f. It should be noted that the length the first radiation shield gap 114f extends along the first side 142 of the support structure 106f and the length the second radiation shield gap 114g extends along the second side 144 of the support structure 106f do not have to be in the same location or the same length and depends on design constraints and user preference.

The electronic component 104f can extend across the radiation shield gap 114h on a first side 146 of the radiation shield wall 112f and cover the radiation shield gap 114h. A conductive layer 116a can be over the portion of the electronic component 104f that extends across the first radiation shield gap 114f on the first side 146 of the radiation shield wall 112f. The electronic component 104g can extend across the second radiation shield gap 114g on a second side 148 of the radiation shield wall 112f. A conductive layer 116b can be over the portion of the electronic component 104g that extends across the second radiation shield gap 114g on the second side 148 of the radiation shield wall 112f. By creating the first radiation shield gap 114f and the second radiations shield gap 114g in the radiation shield wall 112f, additional area in the X plane (or Y plane, depending on the orientation) on the support structure 106f can be created to accommodate tracings and the radiation source 108n.

Figure 13:
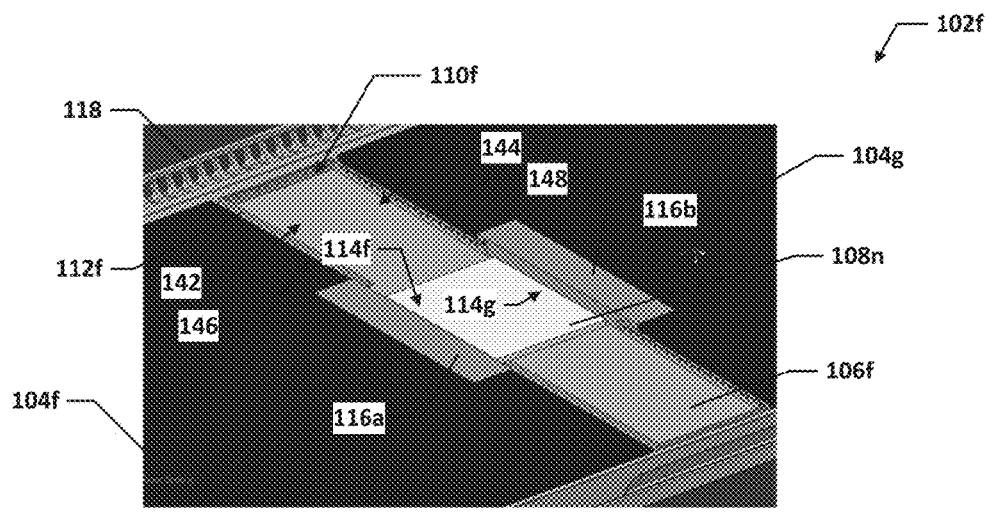
FIG. 13 is a simplified perspective top cut away view of a portion of a system to enable a radiation shield with a radiation shield gap, in accordance with an embodiment of the present disclosure.

Turning to FIG. 13, FIG. 13 is a simplified diagram of a cut away perspective view of a portion of the electronic device 102f, in accordance with an embodiment of the present disclosure. In an example, the electronic device 102f can include the electronic component 104f, the electronic component 104g, the support structure 106f, and the chassis 118. The electronic component 104f can be on a first side 142 of the support structure 106f and the electronic component 104g can be on a second side 144 of the support structure 106f.

The support structure 106f can include one or more radiation sources 108. For example, as illustrated in FIG. 13, the support structure 106f includes the radiation source 108n. The radiation shield 110f can be coupled to the support structure 106f and over the radiation source 108n to help contain the radiation from the radiation source 108n. The radiation shield 110f can include the radiation shield wall 112g. The radiation shield wall 112g can include the first radiation shield gap 114f and the second radiation shield gap 114g. The first radiation shield gap 114f and the second radiation shield gap 114g allow for addition space on the support structure 106f to be used for tracing and/or to accommodate the radiation sources 108n. If the radiation shield wall 112f was continuous, then the radiation shield wall 112f would occupy space on the support structure 106f that could be used for tracing and/or to accommodate the radiation source 108n. For example, as illustrated in FIG. 13, the first radiation shield gap 114f extends along an approximate middle section of the support structure 106f on the first side 142 of the support structure 106f and the second radiation shield gap 114g extends along an approximate middle section of the support structure 106f on the second side 144 of the support structure 106f. It should be noted that the length the first radiation shield gap 114f extends along the first side 142 of the support structure 106f and the length the second radiation shield gap 114g extends along the second side 144 of the support structure 106f do not have to be in the same location or the same length and depends on design constraints and user preference.

The electronic component 104f can extend across the radiation shield gap 114h on the first side 146 of the radiation shield wall 112f. The conductive layer 116a can be over the portion of the electronic component 104f that extends across the first radiation shield gap 114f on the first side 146 of the radiation shield wall 112f. The electronic component 104g can extend across the second radiation shield gap 114g on the second side 148 of the radiation shield wall 112f. The conductive layer 116b can be over the portion of the electronic component 104g that extends across the second radiation shield gap 114g on the second side 148 of the radiation shield wall 112f. By creating the first radiation shield gap 114f and the second radiation shield gap 114g in the radiation shield wall 112c, additional area in the X plane (or Y plane, depending on the orientation) on the support structure 106f can be created to accommodate tracings and the radiation source 108n.

Figure 14:
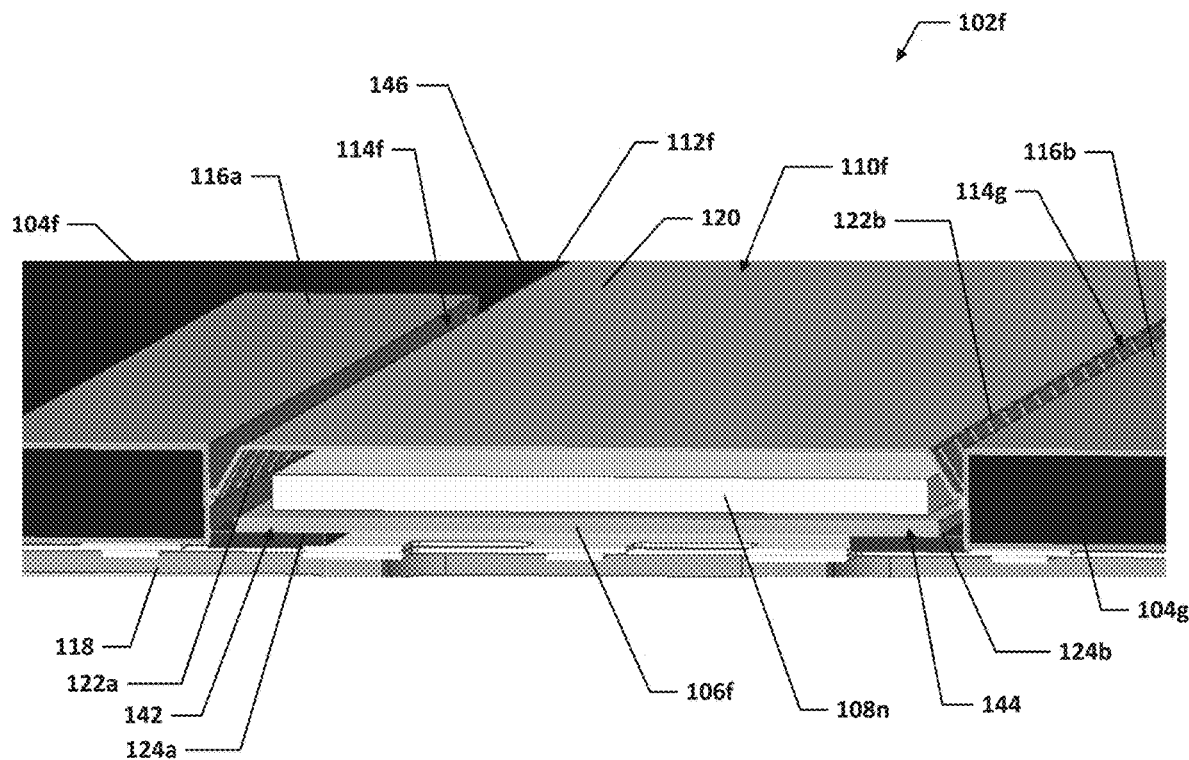
FIG. 14 is a simplified perspective side cut away view of a portion of a system to enable a radiation shield with a radiation shield gap, in accordance with an embodiment of the present disclosure.

Turning to FIG. 14, FIG. 14 is a simplified diagram of a cut away perspective side view of a portion of the electronic device 102f, in accordance with an embodiment of the present disclosure. In an example, the electronic device 102f can include the electronic component 104f, the electronic component 104g, the support structure 106f, and the chassis 118. The electronic component 104f can be on the first side 142 of the support structure 106f and the electronic component 104g can be on the second side 144 of the support structure 106f.

The support structure 106f can include one or more radiation sources 108. For example, as illustrated in FIG. 14, the support structure 106f includes the radiation source 108n. The radiation shield 110f can be coupled to the support structure 106f and over the radiation source 108n to help contain the radiation from the radiation source 108n. The radiation shield 110f can include the radiation shield wall 112g, the radiation shield lid 120, a first side horizontal extension 122a, and a second side horizontal extension 122b to help provide grounding of the radiation shield 110f and help to prevent radiation leaks from the radiation shield 110f. The radiation shield wall 112g can include the first radiation shield gap 114f and the second radiation shield gap 114g. The first radiation shield gap 114f and the second radiation shield gap 114g allow for addition space on the support structure 106f to be used for tracing and/or to accommodate the radiation sources 108n. If the radiation shield wall 112f was continuous, then the radiation shield wall 112f would occupy space on the support structure 106f that could be used for tracing and/or to accommodate the radiation source 108n.

The electronic component 104f can extend across the first radiation shield gap 114f on the first side 146 of the radiation shield wall 112f. The conductive layer 116a can be over the portion of the electronic component 104f that extends across the first radiation shield gap 114f on the first side 146 of the radiation shield wall 112f. The electronic component 104g can extend across the second radiation shield gap 114g on the second side 148 (not referenced) of the radiation shield wall 112f (not shown on the second side 148). The conductive layer 116b can be over the portion of the electronic component 104g that extends across the second radiation shield gap 114g on the second side 148 (not referenced) of the radiation shield wall 112f (not shown on the second side 148).

The first side horizontal extension 122a can extend from the radiation shield lid 120 and contact the conductive layer 116a to help provide grounding of the radiation shield 110f and help to prevent radiation leaks from the radiation shield 110*f*. The second side horizontal extension 122*b* can extend from the radiation shield lid 120 and contact the conductive layer 116*b* to help provide grounding of the radiation shield 110*f* and help to prevent radiation leaks from the radiation shield 110*f*. A first side ground contact 124*a* and a second side ground contact 124*b* can be between the support structure 106*f* and the chassis 118. In an example, the first side ground contact 124*a* can be a conductive elastic component in contact with the conductive layer 116*a* and a ground plane (not shown) of the support structure 106*f* to help ground the radiation shield 110*f*. Also, the second side ground contact 124*b* can be a conductive elastic component in contact with the conductive layer 116*b* and a ground plane (not shown) of the support structure 106*f* to help ground the radiation shield 110*f*. By creating the first radiation shield gap 114*f* and the second radiation shield gap 114*g* in the radiation shield wall 112*f*, additional area in the X plane (or Y plane, depending on the orientation) on the support structure 106*f* can be created to accommodate tracings and the radiation source 108*n*.

Figure 15:
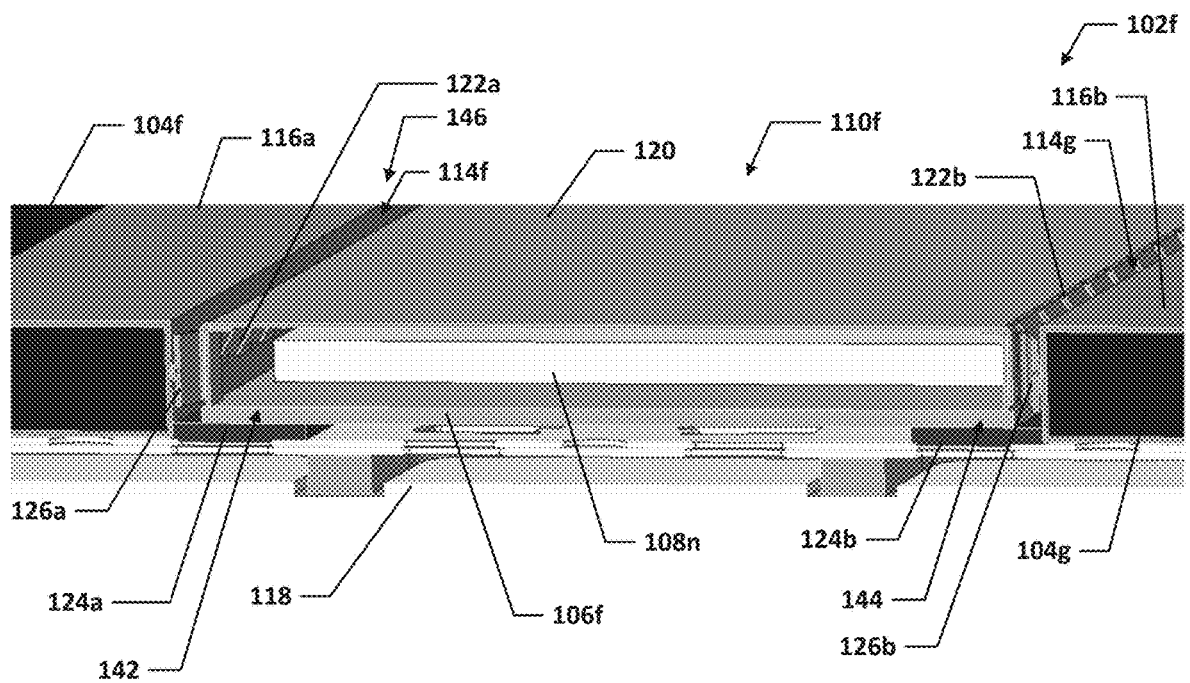
FIG. 15 is a simplified perspective side cut away view of a portion of a system to enable a radiation shield with a radiation shield gap, in accordance with an embodiment of the present disclosure.

Turning to FIG. 15, FIG. 15 is a simplified block diagram of a cut away perspective side view of a portion of the electronic device 102*f*, in accordance with an embodiment of the present disclosure. In an example, the electronic device 102*f* can include the electronic component 104*f*, the electronic component 104*g*, the support structure 106*f*, and the chassis 118. The electronic component 104*f* can be on the first side 142 of the support structure 106*f* and the electronic component 104*g* can be on the second side 144 of the support structure 106*f*.

The support structure 106*f* can include one or more radiation sources 108. For example, as illustrated in FIG. 15, the support structure 106*f* includes the radiation source 108*n*. The radiation shield 110*f* can be coupled to the support structure 106*f* and over the radiation source 108*n* to help contain the radiation from the radiation source 108*n*. The radiation shield 110*f* can include the radiation shield wall 112*g* (not shown), the radiation shield lid 120, the first side horizontal extension 122*a*, the second side horizontal extension 122*b*, a first side vertical extension 126*a*, and a second side vertical extension 126*b* to help provide grounding of the radiation shield 110*f* and help to prevent radiation leaks from the radiation shield 110*f*. The radiation shield wall 112*g* (not shown) can include the first radiation shield gap 114*f* and the second radiation shield gap 114*g*. The first radiation shield gap 114*f* and the second radiation shield gap 114*g* allow for addition space on the support structure 106*f* to be used for tracing and/or to accommodate the radiation source 108*n*. If the radiation shield wall 112*f* was continuous, then the radiation shield wall 112*f* would occupy space on the support structure 106*f* that could be used for tracing and/or to accommodate the radiation source 108*n*.

The electronic component 104*f* can extend across the radiation shield gap 114*h* on the first side 146 of the radiation shield wall 112*f*. The conductive layer 116*a* can be over the portion of the electronic component 104*f* that extends across the first radiation shield gap 114*f* on the first side 146 of the radiation shield wall 112*f*. The electronic component 104*g* can extend across the second radiation shield gap 114*g* on the second side 148 (not referenced) of the radiation shield wall 112*f* (not shown on the second side 148). The conductive layer 116*b* can be over the portion of the electronic component 104*g* that extends across the second radiation shield gap 114*g* on the second side 148 (not referenced) of the radiation shield wall 112*f* (not shown on the second side 148).

The first side horizontal extension 122*a* can extend from the radiation shield lid 120 and contact the conductive layer 116*a* to help provide grounding of the radiation shield 110*f* and help to prevent radiation leaks from the radiation shield 110*f*. The second side horizontal extension 122*b* can extend from the radiation shield lid 120 and contact the conductive layer 116*b* to help provide grounding of the radiation shield 110*f* and help to prevent radiation leaks from the radiation shield 110*f*. The first side vertical extension 126*a* can extend along the vertical edge of the first radiation shield gap 114*f* to help provide grounding of the radiation shield 110*f* and help to prevent radiation leaks from the radiation shield 110*f*. Note that the radiation shield 110*f* would include another first side vertical extension 126*a* that would extend along the other vertical edge of the first radiation shield gap 114*f* (e.g., similar to the vertical extensions 126 on either side of the radiation shield gap 114*c* illustrated in FIG. 9). The second side vertical extension 126*b* can extend along the vertical edge of the second radiation shield gap 114*g* to help provide grounding of the radiation shield 110*f* and help to prevent radiation leaks from the radiation shield 110*f*. Note that the radiation shield 110*f* would include another second side vertical extension 126*b* that would extend along the other vertical edge of the second radiation shield gap 114*g* (e.g., similar to the vertical extensions 126 on either side of the radiation shield gap 114*c* illustrated in FIG. 9). In an example, the first side horizontal extension 122*a*, the second side horizontal extension 122*b*, the first side vertical extension 126*a*, and the second side vertical extension 126*b* can each include vertical dimple fingers (e.g., as illustrated in FIGS. 8A and 8B) that can be used to help provide grounding of the radiation shield 110*f* and help to prevent radiation leaks from the radiation shield 110*f*. The first side ground contact 124*a* and the second side ground contact 124*b* can be between the support structure 106*f* and the chassis 118. By creating the first radiation shield gap 114*f* and the second radiation shield gap 114*g* in the radiation shield wall 112*f*, additional area in the X plane (or Y plane, depending on the orientation) on the support structure 106*f* can be created to accommodate tracings and the radiation source 108*n*.

Figure 16:
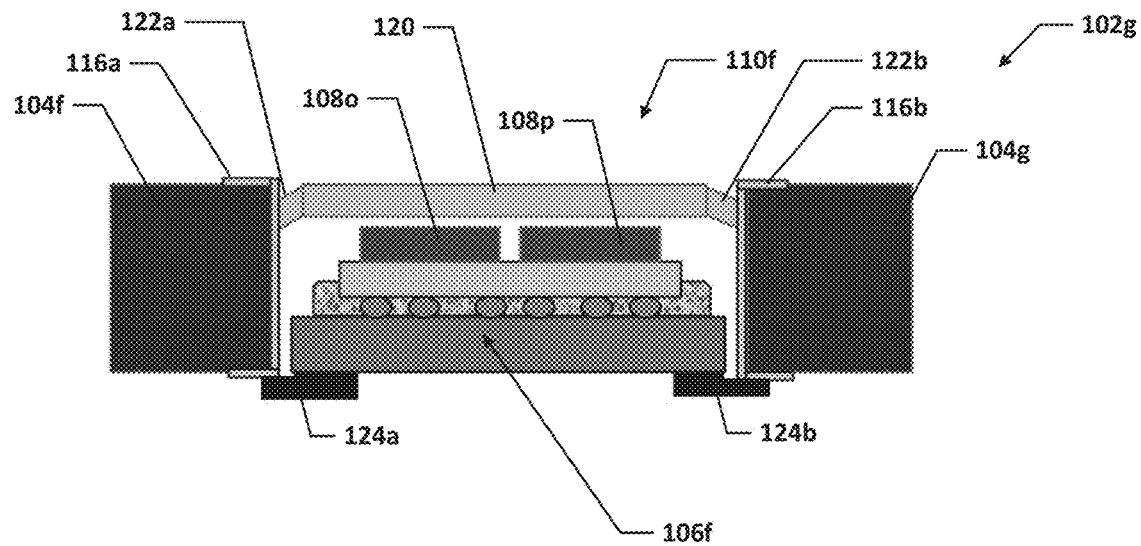
FIG. 16 is a simplified block diagram of a cut away side view of a portion of a system to enable a radiation shield with a radiation shield gap, in accordance with an embodiment of the present disclosure.

Turning to FIG. 16, FIG. 16 is a simplified block diagram of a cut away side view of a portion of an electronic device 102*g*, in accordance with an embodiment of the present disclosure. In an example, the electronic device 102*g* can include the electronic component 104*f*, the electronic component 104*g*, and the support structure 106*f*. The electronic component 104*f* can be on the first side 142 of the support structure 106*f* and the electronic component 104*g* can be on the second side 144 of the support structure 106*f*.

The support structure 106*f* can include one or more radiation sources 108. For example, as illustrated in FIG. 16, the support structure 106*f* includes the radiation sources 108*o* and 108*p*. The radiation shield 110*f* can be coupled to the support structure 106*f* and over the radiation sources 108*o* and 108*p* to help contain the radiation from the radiation sources 108*o* and 108*p*. The radiation shield 110*f* can include a radiation shield wall (not shown), the radiation shield lid 120, the first side horizontal extension 122*a*, and the second side horizontal extension 122*b* to help provide grounding of the radiation shield 110*f* and help to prevent radiation leaks from the radiation shield 110*f*. The radiation shield wall (e.g., the radiation shield wall 112*g* illustrated in FIGS. 12-15) can include a first radiation shield gap (e.g., the first radiation shield gap 114*f* illustrated in FIGS. 12-15) and a second radiation shield gap (e.g., the second radiation shield gap 114*g* illustrated in FIGS. 12-15). The first radiation shield gap (not referenced) and the second radiation shield gap (not referenced) allow for addition space on the support structure 106f to be used for tracing and/or to accommodate the radiation sources 108o and 108p. If the radiation shield wall (not shown) was continuous, then the radiation shield wall (not shown) would occupy space on the support structure 106f that could be used for tracing and/or to accommodate the radiation sources 108o and 108p.

The electronic component 104f can extend across the first radiation shield gap (not referenced) on the first side of the radiation shield wall (not shown). The conductive layer 116a can be over the portion of the electronic component 104f that extends across the first radiation shield gap (not referenced) on the first side of the radiation shield wall (not shown). The electronic component 104g can extend across the second radiation shield gap (not referenced) on the second side of the radiation shield wall (not shown). The conductive layer 116b can be over the portion of the electronic component 104g that extends across the second radiation shield gap (not referenced) on the second side of the radiation shield wall (not shown).

The first side horizontal extension 122a can extend from the radiation shield lid 120 and contact the conductive layer 116a to help provide grounding of the radiation shield 110f and help to prevent radiation leaks from the radiation shield 110f. The second side horizontal extension 122b can extend from the radiation shield lid 120 and contact the conductive layer 116b to help provide grounding of the radiation shield 110f and help to prevent radiation leaks from the radiation shield 110f. The first side ground contact 124a and the second side ground contact 124b can be between the support structure 106f and a chassis of the electronic device (e.g., the chassis 118 illustrated in FIGS. 13-15). By creating the first radiation shield gap (not referenced) and the second radiation shield gap (not referenced) in the radiation shield wall (not shown), additional area in the X plane (or Y plane, depending on the orientation) on the support structure 106f can be created to accommodate tracings and the radiation sources 108o and 108p.

Figure 17:
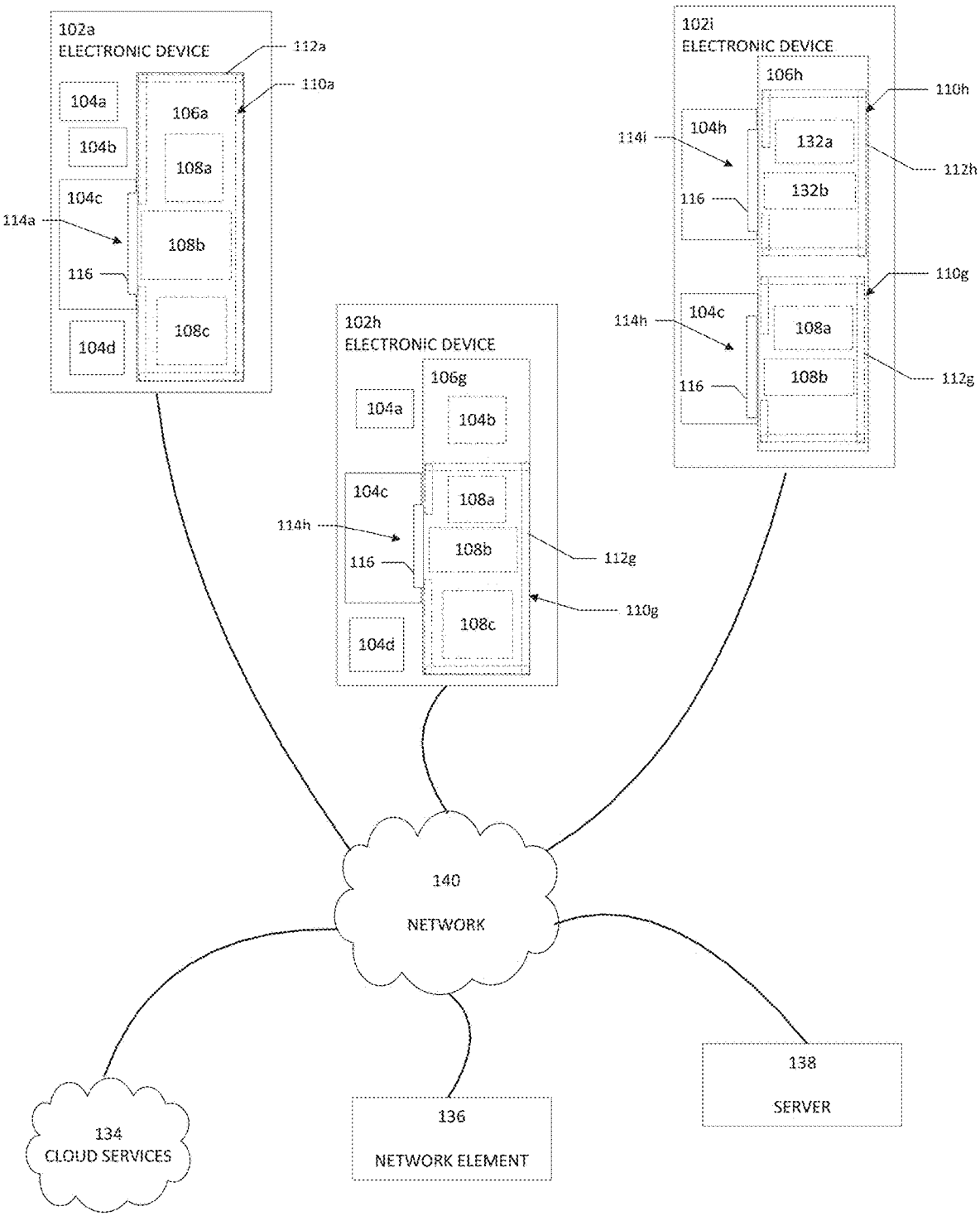
FIG. 17 is a block diagram illustrating example devices that include a radiation shield with a radiation shield gap, in accordance with an embodiment of the present disclosure.

Turning to FIG. 17, FIG. 17 is a simplified block diagram of electronic devices configured with a radiation shield with a radiation shield gap, in accordance with an embodiment of the present disclosure. For example, as illustrated in FIG. 17, the electronic device 102a can include the one or more electronic components 104a-104d and the support structure 106a. The support structure 106a can include the one or more radiation sources 108a-108c. The radiation shield 110a can be over the radiation sources 108a-108c. The radiation shield 110a can include the radiation shield wall 112a that partially extends around the radiation sources 108a-108c on the support structure 106a. The radiation shield wall 112a does not continuously extend around the radiation sources 108a-108c and includes the radiation shield gap 114a in the radiation shield wall 112a. The radiation shield gap 114a allows for addition space on the support structure 106a to be used for tracing and/or to accommodate the radiation source 108b and/or traces. If the radiation shield wall 112a was continuous, then the radiation shield wall 112a would occupy space on the support structure 106a that could be used for tracing and/or to accommodate the radiation source 108b. The electronic component 104c can extend across the radiation shield gap 114a in the radiation shield wall 112a. The conductive layer 116 can be over the portion of the electronic component 104c that extends across the radiation shield gap 114a in the radiation shield wall 112a to help close the gap in the radiation shield wall 112a.

In addition, an electronic device 102h can include the one or more electronic components 104a, 104c, and 104d and a support structure 106g. The support structure 106g can include the one or more radiation sources 108a-108c and the electronic component 104b. In an example, the support structure 106g can be a substrate and more particularly, a PCB. A radiation shield 110g can be over the radiation sources 108a-108c. The radiation shield 110g can include a radiation shield wall 112g that partially extends around the radiation sources 108a-108c on the support structure 106a. The radiation shield wall 112g does not continuously extend around the radiation sources 108a-108c and includes a radiation shield gap 114h in the radiation shield wall 112g. The radiation shield gap 114h allows for addition space on the support structure 106g to be used for tracing and/or to accommodate the radiation source 108b and/or traces. If the radiation shield wall 112g was continuous, then the radiation shield wall 112g would occupy space on the support structure 106g that could be used for tracing and/or to accommodate the radiation source 108b. The electronic component 104c can extend across the radiation shield gap 114h in the radiation shield wall 112g. The conductive layer 116 can be over the portion of the electronic component 104c that extends across the radiation shield gap 114h in the radiation shield wall 112g to help close the gap in the radiation shield wall 112g.

Also, an electronic device 102i can include the one or more electronic components 104c and 104h and a support structure 106h. The support structure 106h can include the one or more radiation sources 108a and 108b and one or more radiation sensitive devices 132. For example, as illustrated in FIG. 17, the support structure 106h can include radiation sensitive devices 132a and 132b. The radiation sensitive devices 132a and 132b are devices that are sensitive to radiation from radiation sources 108a and 108b and/or radiation from outside of electronic device 102i. In an example, the support structure 106h can be a substrate and more particularly, a PCB.

The radiation shield 110g can be over the radiation sources 108a and 108b. The radiation shield 110g can include the radiation shield wall 112g that partially extends around the radiation sources 108a and 108b on the support structure 106h. The radiation shield wall 112g does not continuously extend around the radiation sources 108a and 108b and includes the radiation shield gap 114h in the radiation shield wall 112h. The radiation shield gap 114h allows for addition space on the support structure 106h to be used for tracing and/or to accommodate the radiation source 108b and/or traces. If the radiation shield wall 112g was continuous, then the radiation shield wall 112g would occupy space on the support structure 106h that could be used for tracing and/or to accommodate the radiation source 108b. The electronic component 104c can extend across the radiation shield gap 114h in the radiation shield wall 112g. The conductive layer 116 can be over the portion of the electronic component 104c that extends across the radiation shield gap 114h in the radiation shield wall 112g to help close the gap in the radiation shield wall 112g.

In addition, a radiation shield 110h can be over the one or more radiation sensitive devices 132a and 132b. The radiation shield 110h can include a radiation shield wall 112h that partially extends around the radiation sensitive devices 132a and 132b on the support structure 106h. The radiation shield wall 112h does not continuously extend around the radiation sensitive devices 132a and 132b and includes the radiation shield gap 114i in the radiation shield wall 112h. The radiation shield gap 114i allows for addition space on the support structure 106h to be used for tracing and/or to accommodate the radiation sensitive device 132b and/or traces. If the radiation shield wall 112$h$ was continuous, then the radiation shield wall 112$h$ would occupy space on the support structure 106$h$ that could be used for tracing and/or to accommodate the radiation sensitive device 132$b$. The electronic component 104$h$ can extend across the radiation shield gap 114$i$ in the radiation shield wall 112$h$ and cover the radiation shield gap 114$i$. The conductive layer 116 can be over the portion of the electronic component 104$h$ that extends across the radiation shield gap 114$i$ in the radiation shield wall 112$h$ to help close the gap in the radiation shield wall 112$h$ and help shield the one or more radiation sensitive devices 132$a$ and 132$b$ from the radiation from the one or more radiation sources 108$a$ and 108$b$ or at least partially mitigate the effects of the radiation from the one or more radiation sources 108$a$ and 108$b$ from affecting the one or more radiation sensitive devices 132$a$ and 132$b$ and/or to help shield the one or more radiation sensitive devices 132$a$ and 132$b$ from the radiation from the one or more radiation sources outside of the electronic device 102$i$ or at least partially mitigate the effects of the radiation from the one or more radiation sources outside of the electronic device 102$i$ from affecting the one or more radiation sensitive devices 132$a$ and 132$b$ Each of electronic devices 102$a$, 102$h$, and 102$i$ (and electronic devices 102$b$-102$g$) may be in communication with each other, cloud services 134, network element 136, and/or server 138 using a network 140. In some examples, one or more of electronic devices 102$a$, 102$h$, and 102$i$ (and electronic devices 102$b$-102$g$) may be standalone devices and not connected to network 140 or another device.

Elements of FIG. 17 may be coupled to one another through one or more interfaces employing any suitable connections (wired or wireless), which provide viable pathways for network (e.g., network 140, etc.) communications. Additionally, any one or more of these elements of FIG. 17 may be combined or removed from the architecture based on particular configuration needs. Network 140 may include a configuration capable of transmission control protocol/Internet protocol (TCP/IP) communications for the transmission or reception of packets in a network. Each of electronic devices 102$a$, 102$h$, and 102$i$ (and electronic devices 102$b$-102$g$) may also operate in conjunction with a user datagram protocol/IP (UDP/IP) or any other suitable protocol where appropriate and based on particular needs.

Turning to the network infrastructure of FIG. 17, network 140 represents a series of points or nodes of interconnected communication paths for receiving and transmitting packets of information. Network 140 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 140, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, electronic devices 102$a$-102$i$ are meant to encompass a computer, a personal digital assistant (PDA), a laptop or electronic notebook, a cellular telephone, a smartphone, an IP phone, network elements, network appliances, servers, routers, switches, gateways, bridges, load balancers, processors, modules, or any other device, component, element, or object that includes a radiation source and/or a radiation sensitive device. Each of electronic devices 102$a$-102$i$ may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Each of electronic devices 102$a$-102$d$ may include virtual elements.

In regards to the internal structure, each of electronic devices 102$a$-102$i$ can include memory elements for storing information to be used in operations. Each of electronic devices 102$a$-102$i$ may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations. This includes the memory elements being able to store software, logic, code, or processor instructions that are executed to carry out operations or activities.

Additionally, each of electronic devices 102$a$-102$i$ can include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Implementations of the embodiments disclosed herein may be formed or carried out on or over a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

Note that with the examples provided herein, interaction may be described in terms of one, two, three, or more elements. However, this has been done for purposes of clarity and example only. In certain cases, it may be easier to describe one or more of the functionalities by only referencing a limited number of elements. It should be appreciated that electronic devices 102a-102i and their teachings are readily scalable and can accommodate a large number of components, as well as more complicated/sophisticated arrangements and configurations. Accordingly, the examples provided should not limit the scope or inhibit the broad teachings of electronic devices 102a-102i and as potentially applied to a myriad of other architectures.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although electronic devices 102a-102i have been illustrated with reference to particular elements and operations, these elements and operations may be replaced by any suitable architecture, protocols, and/or processes that achieve the intended functionality of electronic devices 102a-102i.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

In Example A1, is an electronic device including an electronic component, a support structure that includes a radiation source, and a radiation shield on the support structure, where the radiation shield includes a radiation shield wall that is not continuous around the radiation source and includes a radiation shield gap, where a portion of the electronic component covers the radiation shield gap to complete the radiation shield wall.

In Example A2, the subject matter of Example A1 can optionally include a conductive layer over the portion of the electronic component that covers the radiation shield gap, where the conductive layer is coupled to a ground of the support structure.

In Example A3, the subject matter of any one of Examples A1-A2 can optionally include a horizontal extension that extends along the radiation shield gap from the radiation shield to the conductive layer and is parallel to the support structure.

In Example A4, the subject matter of any one of Examples A1-A3 can optionally include where the horizontal extension includes dimples that contact the conductive layer.

In Example A5, the subject matter of any one of Examples A1-A4 can optionally include where at least one vertical extension extends from the radiation shield to the conductive layer along a vertical plane that is perpendicular to the support structure.

In Example A6, the subject matter of any one of Examples A1-A5 can optionally include where the at least one vertical extension includes at least one dimple that contacts the conductive layer.

In Example A7, the subject matter of any one of Examples A1-A6 can optionally include where the electronic component is a battery.

In Example A8, the subject matter of any one of Examples A1-A7 can optionally include where the radiation shield mitigates effects of at least a portion of electromagnetic interference (EMI) and/or radio-frequency interference (RFI) emitted from the radiation source.

In Example A9, the subject matter of any one of Examples A1-A8 can optionally include where the support structure is a printed circuit board.

Example AA1 is a radiation shield including a radiation shield wall, where the radiation shield wall is not continuous and includes a radiation shield gap, a radiation shield lid over the radiation shield wall, a horizontal extension that extends from the radiation shield lid and into the radiation shield gap, and a vertical extension that extends along an edge of the radiation shield gap.

In Example AA2, the subject matter of Example AA1 can optionally include where the horizontal extension contacts a conductive layer over an electronic component, where the electronic component extends across the radiation shield gap and covers the radiation shield gap to complete the radiation shield wall.

In Example AA3, the subject matter of any one of Examples AA1-AA2 can optionally include where the vertical extension contacts the conductive layer over the electronic component.

In Example AA4, the subject matter of any one of Examples AA1-AA3 can optionally include where the radiation shield is grounded to a ground plane in a printed circuit board.

In Example AA5, the subject matter of any one of Examples AA1-AA4 can optionally include where the radiation shield wall, the radiation shield lid, the horizontal extension, and the vertical extension define an interior space of the radiation shield that houses a radiation source that emits electromagnetic interference (EMI) and/or radio-frequency interference (RFI).

In Example AA6, the subject matter of any one of Examples AA1-AA5 can optionally include where the radiation shield wall, the radiation shield lid, the horizontal extension, and the vertical extension define an interior space of the radiation shield that houses a radiation sensitive device that is affected by electromagnetic interference (EMI) and/or radio-frequency interference (RFI).

Example M1 is a method including identifying a radiation source on a printed circuit board, identifying an electronic component on the printed circuit board, and creating a radiation shield to mitigate radiation effects from the radiation source, where the radiation shield includes a radiation shield wall that is not continuous around the radiation source and includes a radiation shield gap, where a portion of an electronic component covers the radiation shield gap to complete the radiation shield wall.

In Example M2, the subject matter of Example M1 can optionally include adding a conductive layer to the electronic component over the portion of the electronic component that covers the radiation shield gap, where the conductive layer coupled to a ground of the printed circuit board and coupling the radiation shield to the conductive layer.

In Example M3, the subject matter of any one of the Examples M1-M2 can optionally include where a horizontal extension extends from the radiation shield to the conductive layer along a plane that is parallel to the printed circuit board.

In Example M4, the subject matter of any one of the Examples M1-M3 can optionally include where at least one vertical extension extends from the radiation shield to the conductive layer along a vertical plane that is perpendicular to the printed circuit board.

In Example M5, the subject matter of any one of the Examples M1-M4 can optionally include where the electronic component is a battery.

What is claimed is:

1. An electronic device comprising:
    an electronic component;
    a support structure that includes a radiation source; and
    a radiation shield on the support structure, wherein the radiation shield includes a radiation shield wall that is not continuous around the radiation source and includes a radiation shield gap, wherein a portion of the electronic component covers the radiation shield gap to complete the radiation shield wall.

2. The electronic device of claim 1, further comprising:
    a conductive layer over the portion of the electronic component that covers the radiation shield gap, wherein the conductive layer is coupled to a ground of the support structure.

3. The electronic device of claim 2, further comprising:
    a horizontal extension that extends along the radiation shield gap from the radiation shield to the conductive layer and is parallel to the support structure.

4. The electronic device of claim 3, wherein the horizontal extension includes dimples that contact the conductive layer.

5. The electronic device of claim 2, wherein at least one vertical extension extends from the radiation shield to the conductive layer along a vertical plane that is perpendicular to the support structure.

6. The electronic device of claim 5, wherein the at least one vertical extension includes at least one dimple that contacts the conductive layer.

7. The electronic device of claim 1, wherein the electronic component is a battery.

8. The electronic device of claim 1, wherein the radiation shield mitigates effects of at least a portion of electromagnetic interference (EMI) and/or radio-frequency interference (RFI) emitted from the radiation source.

9. The electronic device of claim 1, wherein the support structure is a printed circuit board.

10. A radiation shield comprising:
    a radiation shield wall, wherein the radiation shield wall is not continuous and includes a radiation shield gap;
    a radiation shield lid over the radiation shield wall;
    a horizontal extension that extends from the radiation shield lid and into the radiation shield gap; and
    a vertical extension that extends along an edge of the radiation shield gap,
    wherein the horizontal extension contacts a conductive layer over an electronic component, wherein the electronic component extends across the radiation shield gap and covers the radiation shield gap to complete the radiation shield wall.

11. The radiation shield of claim 10, wherein the vertical extension contacts the conductive layer over the electronic component.

12. The radiation shield of claim 10, wherein the radiation shield is grounded to a ground plane in a printed circuit board.

13. The radiation shield of claim 10, wherein the radiation shield wall, the radiation shield lid, the horizontal extension, and the vertical extension define an interior space of the radiation shield that houses a radiation source that emits electromagnetic interference (EMI) and/or radio-frequency interference (RFI).

14. The radiation shield of claim 10, wherein the radiation shield wall, the radiation shield lid, the horizontal extension, and the vertical extension define an interior space of the radiation shield that houses a radiation sensitive device that is affected by electromagnetic interference (EMI) and/or radio-frequency interference (RFI).

15. A method comprising:
    identifying a radiation source on a printed circuit board;
    identifying an electronic component on the printed circuit board; and
    creating a radiation shield to mitigate radiation effects from the radiation source, wherein the radiation shield includes a radiation shield wall that is not continuous around the radiation source and includes a radiation shield gap, wherein a portion of an electronic component covers the radiation shield gap to complete the radiation shield wall.

16. The method of claim 15, further comprising:

adding a conductive layer to the electronic component over the portion of the electronic component that covers the radiation shield gap, wherein the conductive layer coupled to a ground of the printed circuit board; and coupling the radiation shield to the conductive layer.

17. The method of claim 16, wherein a horizontal extension extends from the radiation shield to the conductive layer along a plane that is parallel to the printed circuit board.

18. The method of claim 16, wherein at least one vertical extension extends from the radiation shield to the conductive layer along a vertical plane that is perpendicular to the printed circuit board.

19. The method of claim 16, wherein the electronic component is a battery.

\* \* \* \* \*